United States Patent
Ogawa

(10) Patent No.: US 12,278,609 B2
(45) Date of Patent: Apr. 15, 2025

(54) FILTER DEVICE AND RADIO-FREQUENCY FRONT-END CIRCUIT INCLUDING THE SAME

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 239 days.

(21) Appl. No.: 18/107,552

(22) Filed: Feb. 9, 2023

(65) Prior Publication Data
US 2023/0188111 A1 Jun. 15, 2023

Related U.S. Application Data

(63) Continuation of application No. PCT/JP2021/035278, filed on Sep. 27, 2021.

(30) Foreign Application Priority Data

Oct. 2, 2020 (JP) .................................. 2020-167576
Mar. 24, 2021 (JP) .................................. 2021-050290

(51) Int. Cl.
 *H03H 7/01* (2006.01)
 *H01F 27/28* (2006.01)
 (Continued)

(52) U.S. Cl.
 CPC ....... *H03H 7/0115* (2013.01); *H01F 27/2804* (2013.01); *H01F 27/29* (2013.01);
 (Continued)

(58) Field of Classification Search
 CPC ............ H01P 1/20345; H03H 1/20345; H03H 2001/0085; H03H 7/0115
 (Continued)

(56) References Cited

U.S. PATENT DOCUMENTS

| 2010/0321130 A1* | 12/2010 | Kim ........................ H03H 7/48 333/101 |
| 2013/0229241 A1 | 9/2013 | Imamura |
| 2013/0241672 A1 | 9/2013 | Tamaru et al. |

FOREIGN PATENT DOCUMENTS

| JP | 6376313 A | 4/1988 |
| JP | 2019079865 A | 5/2019 |

(Continued)

OTHER PUBLICATIONS

International Search Report in PCT/JP2021/035278, mailed Dec. 7, 2021, 3 pages.

(Continued)

*Primary Examiner* — Rakesh B Patel
(74) *Attorney, Agent, or Firm* — Keating & Bennett, LLP

(57) ABSTRACT

A filter device includes a body, a ground terminal, and resonators in the body and coupled to each other by electromagnetic field coupling. The resonators include a first resonator coupled to an input terminal, a second resonator coupled to an output terminal, and third and fourth resonators. The second resonator is adjacent to the first resonator in a first direction. The third resonator is adjacent to the first resonator in a second direction perpendicular to the first direction. The fourth resonator is adjacent to the third resonator in the first direction. The third and fourth resonators partially share a path to the ground terminal.

18 Claims, 23 Drawing Sheets

(51) Int. Cl.
  *H01F 27/29*    (2006.01)
  *H01G 4/012*    (2006.01)
  *H01G 4/30*     (2006.01)
  *H01P 1/203*    (2006.01)
  *H03H 1/00*     (2006.01)

(52) U.S. Cl.
  CPC ............... *H01G 4/012* (2013.01); *H01G 4/30* (2013.01); *H01P 1/20345* (2013.01); *H03H 7/0161* (2013.01); *H01F 2027/2809* (2013.01); *H03H 2001/0085* (2013.01)

(58) Field of Classification Search
  USPC .................................. 333/175, 185, 204, 205
  See application file for complete search history.

(56) References Cited

FOREIGN PATENT DOCUMENTS

| WO | 2012066873 A1 | 5/2012 |
| WO | 2012077498 A1 | 6/2012 |
| WO | 2019097774 A1 | 5/2019 |

OTHER PUBLICATIONS

Written Opinion in PCT/JP2021/035278, mailed Dec. 7, 2021, 4 pages.

\* cited by examiner

FILTER DEVICE AND RADIO-FREQUENCY FRONT-END CIRCUIT INCLUDING THE SAME

CROSS REFERENCE TO RELATED APPLICATIONS

This application claims the benefit of priority to Japanese Patent Application No. 2020-167576 filed on Oct. 2, 2020, Japanese Patent Application No. 2021-050290 filed on Mar. 24, 2021 and is a Continuation Application of PCT Application No. PCT/JP2021/035278 filed on Sep. 27, 2021. The entire contents of each application are hereby incorporated herein by reference.

BACKGROUND OF THE INVENTION

1. Field of the Invention

The present disclosure relates to a filter device and a radio-frequency front-end circuit including the filter device, and more particularly, to a technology for improving characteristics of a filter device.

2. Description of the Related Art

There are known multi-stage filter devices including a plurality of LC resonators. For example, Japanese Unexamined Patent Application Publication No. 2019-79865 discloses a band pass filter in which four LC resonators are arranged in one direction at a rectangular solid body. Japanese Unexamined Patent Application Publication No. 2019-79865 discloses a structure in which a ground-side via line is shared by two resonators in the middle.

SUMMARY OF THE INVENTION

The filter devices as described above are used in a wide variety of communication devices such as smartphones, mobile phones, and also mobile phone base stations. For these communication devices, a need exists for further reduction in insertion loss to improve filter characteristics.

Preferred embodiments of the present invention improve loss characteristics of filter devices each including a plurality of LC resonators.

A filter device according to a preferred embodiment of the present disclosure includes a body, a ground terminal, and a plurality of resonators provided in the body to be coupled to each other by electromagnetic field coupling. The plurality of resonators include a first resonator coupled to an input terminal, a second resonator coupled to an output terminal, and a third resonator and a fourth resonator. The second resonator is adjacent to the first resonator in a first direction. The third resonator is adjacent to the first resonator in a second direction perpendicular to the first direction. The fourth resonator is adjacent to the third resonator in the first direction. The third resonator and the fourth resonator partially share a path connected to the ground terminal.

A filter device according to a preferred embodiment of the present disclosure includes four resonators. A resonator coupled to the input terminal (the first resonator) and a resonator coupled to the output terminal (the second resonator) are adjacent to each other in the first direction. With respect to these resonators, two resonators (the third resonator and the fourth resonator) are positioned in the second direction. The third resonator and the fourth resonator are adjacent to each other in the first direction, and the third resonator and the fourth resonator partially share a path connected to the ground terminal. By arranging the four resonators as described above, it is possible to separate the adjacent resonators by some distances, thus improving the Q factor of the filter device. Further, because the intermediate-stage resonators (the third resonator and the fourth resonator) are partially combined in a shared manner, magnetic coupling between these resonators becomes stronger, and as a result, the Q factor of the filter device is further improved. Consequently, the loss characteristics of the filter devices according to preferred embodiments of the present disclosure can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
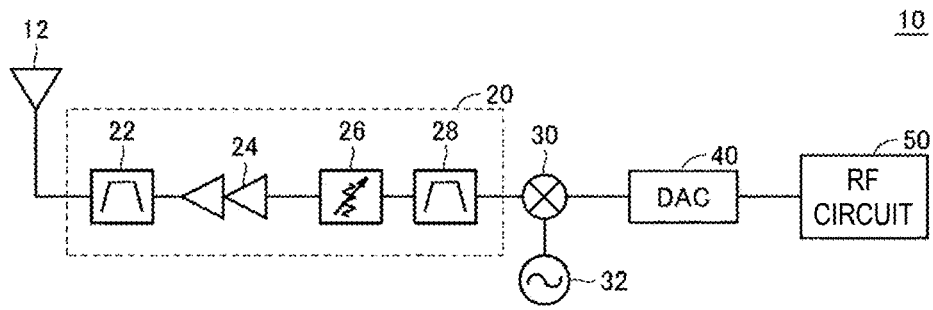
FIG. 1 is a block diagram of a communication device including a radio-frequency front-end circuit including a filter device of a first preferred embodiment of the present invention.

Hereinafter, preferred embodiments of the present disclosure and modifications thereof will be described in detail with reference to the drawings. Identical or corresponding portions in the drawings are assigned identical reference characters, and descriptions thereof are not repeated.

First Preferred Embodiment

Basic Configuration of Communication Device

FIG. 1 is a block diagram of a communication device 10 including a radio-frequency front-end circuit 20 using a filter device of a first preferred embodiment. The communication device 10 is, for example, a portable terminal such as a smartphone, or a mobile phone base station.

Referring to FIG. 1, the communication device 10 includes an antenna 12, the radio-frequency front-end circuit 20, a mixer 30, a local oscillator 32, a digital-to-analog (D/A) converter (DAC) 40, and a radio-frequency (RF) circuit 50. The radio-frequency front-end circuit 20 includes band pass filters 22 and 28, an amplifier 24, and an attenuator 26. FIG. 1 illustrates the case in which the radio-frequency front-end circuit 20 includes a transmit circuit to transmit radio-frequency signals from the antenna 12. The radio-frequency front-end circuit 20 may, however, include a receive circuit to receive radio-frequency signals through the antenna 12.

With the communication device 10, a transmit signal transferred from the RF circuit 50 is up-converted into a radio-frequency signal and emitted from the antenna 12. A modulated digital signal that is a transmit signal outputted from the RF circuit 50 is converted into an analog signal by the D/A converter 40. The mixer 30 mixes an analog transmit signal converted from a digital signal by the D/A converter 40 with an oscillating signal from the local oscillator 32, so that the mixer 30 up-converts the transmit signal into a radio-frequency signal. The band pass filter 28 removes spurious waves generated by up-conversion and extracts only transmit signals of a desired frequency band. The attenuator 26 controls the intensity of transmit signal. The amplifier 24 electrically amplifies the transmit signal passed through the attenuator 26 to a particular level. As well as removing spurious waves generated in the process of amplification, the band pass filter 22 passes only signal components of a frequency band specified by a communication standard. The transmit signal passed through the band pass filter 22 is emitted from the antenna 12.

A filter device according to a preferred embodiment of the present disclosure can be used as the band pass filters 22 and 28 in the communication device 10 described above.

Configuration of Filter Device

Figure 2:
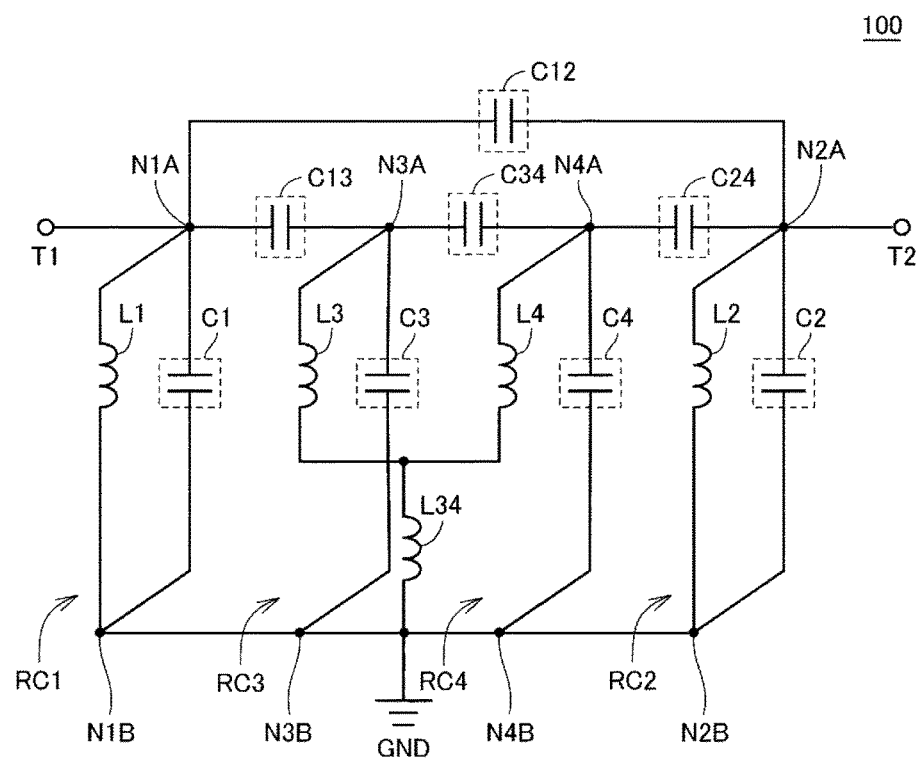
FIG. 2 is an equivalent circuit diagram of the filter device of the first preferred embodiment of the present invention.
Figure 3:
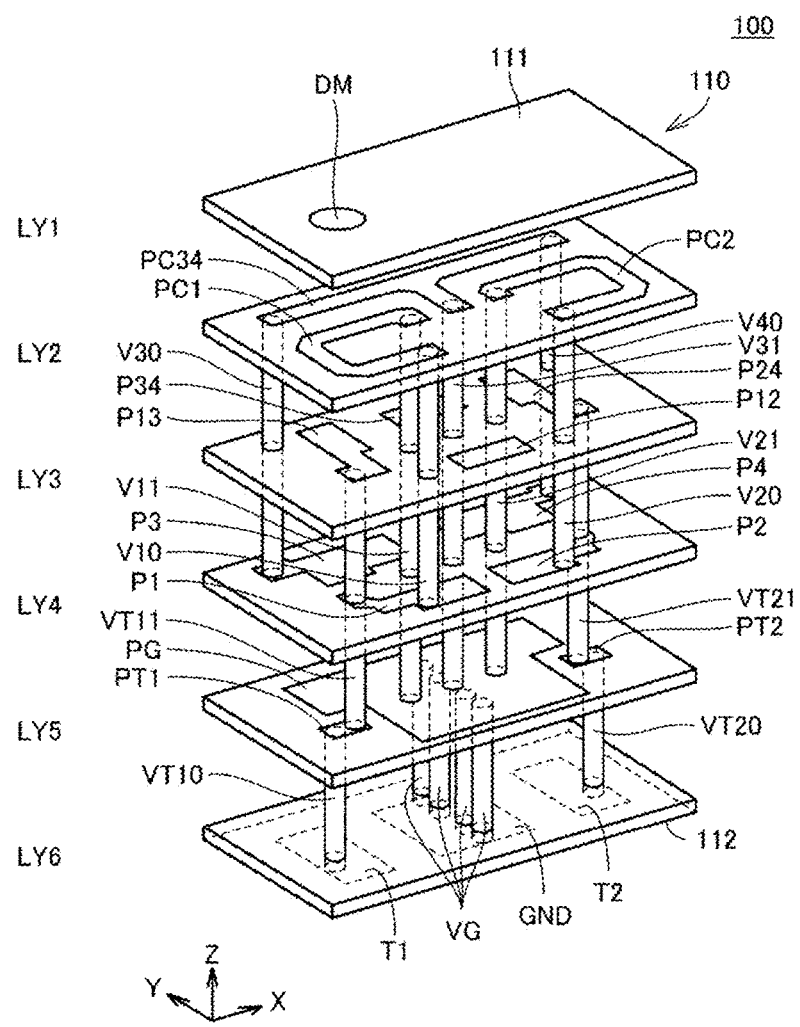
FIG. 3 is an exploded perspective view illustrating an example of a layered structure of the filter device in FIG. 2.
Figure 4:
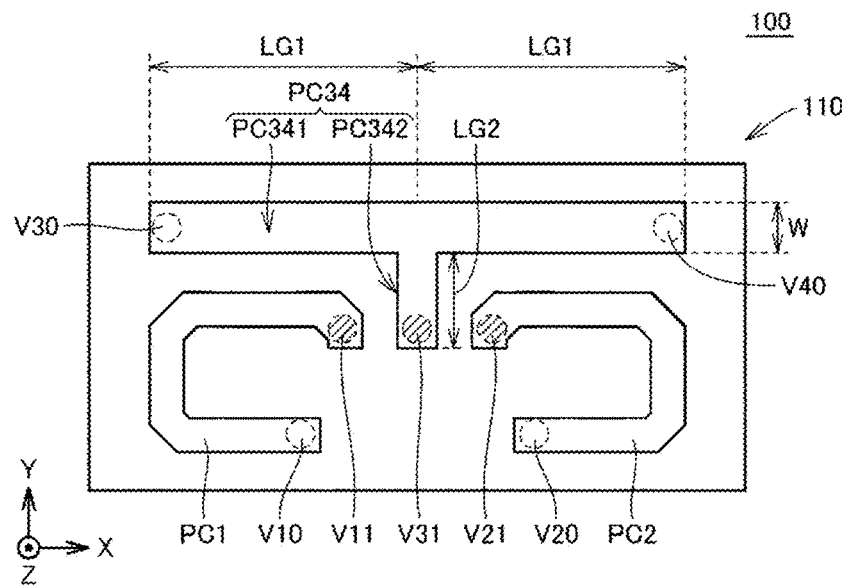
FIG. 4 is a plan view of the filter device in FIG. 3.

The following describes a specific configuration of a filter device 100 of the first preferred embodiment with reference to FIGS. 2 to 4.

FIG. 2 is an equivalent circuit diagram of the filter device 100. Referring to FIG. 2, the filter device 100 includes an input terminal T1, an output terminal T2, and resonators RC1 to RC4. The resonators RC1 to RC4 are all LC parallel resonators each including an inductor and a capacitor. The resonator RC1 is coupled to the input terminal T1. The resonator RC2 is coupled to the output terminal T2. The resonators RC3 and RC4 are coupled between the resonators RC1 and RC2.

The resonator RC1 includes an inductor L1 and a capacitor C1, which are coupled in parallel with other. One connection node N1A of the inductor L1 and the capacitor C1 is coupled to the input terminal T1. The other connection node N1B of the inductor L1 and the capacitor C1 is coupled to a ground terminal GND.

The resonator RC2 includes an inductor L2 and a capacitor C2, which are coupled in parallel with other. One connection node N2A of the inductor L2 and the capacitor C2 is coupled to the output terminal T2. The other connection node N1B of the inductor L2 and the capacitor C2 is coupled to the ground terminal GND.

The resonator RC3 includes inductors L3 and L34 coupled in series with each other and a capacitor C3 coupled in parallel with the inductors L3 and L34. A connection node N3A of the inductor L3 and the capacitor C3 is coupled to the connection node N1A of the resonator RC1 (consequently to the input terminal T1) via a capacitor C13. A connection node N3B of the inductor L34 and the capacitor C3 is coupled to the ground terminal GND.

The resonator RC4 includes an inductor L4 and the inductor L34 coupled in series with each other and a capacitor C4 coupled in parallel with the inductors L4 and L34. A connection node N4A of the inductor L4 and the capacitor C4 is coupled to the connection node N2A of the resonator RC2 (consequently to the output terminal T2) via a capacitor C24. A connection node N4B of the inductor L34 and the capacitor C4 is coupled to the ground terminal GND. This means that the inductor L34 is shared by the resonators RC4 and RC3.

A capacitor C12 is coupled between the connection nodes N1A and N2A. A capacitor C34 is coupled between the connection nodes N3A and N4A.

The resonators are coupled to each other via electromagnetic fields. As described above, the filter device 100 has a configuration including resonators in four stages coupled to each other via electromagnetic fields, arranged between the input terminal T1 and the output terminal T2. Radio-frequency signals inputted to the input terminal T1 are transferred by electromagnetic field coupling of the resonators RC1 to RC4 and outputted from the output terminal T2. At this time, only signals of a frequency band determined by resonant frequencies of the resonators are transferred to the output terminal T2. As a result, by controlling the resonant frequencies of the individual resonators, the filter device 100 operates as a band pass filter that passes signals of a desired frequency band.

FIG. 3 is an exploded perspective view illustrating an example of a layered structure of the filter device 100. FIG. 4 is a plan view of a dielectric layer LY2 of the filter device 100 in FIG. 3.

Referring to FIGS. 3 and 4, the filter device 100 has a rectangular or almost rectangular solid body 110 including a plurality of dielectric layers LY1 to LY6 that are stacked in a given direction. The direction in which the dielectric layers LY1 to LY6 of the body 110 are stacked is referred to as a layer direction. The dielectric layers of the body 110 are made of, for example, a ceramic such as low temperature co-fired ceramics (LTCC), or a resin. Inside the body 110, a plurality of electrodes provided in the dielectric layers and a plurality of vias located between the dielectric layers define inductors and capacitors that define LC resonators. As used in this specification, the term "via" refers to a conductor elongated in the layer direction, provided to connect electrodes in different dielectric layers. The vias are made by, for example, applying a conductive paste, plating, and/or disposing metal pins.

In the following description, the layer direction of the body 110 is referred to as the "Z-axis direction"; the direction along the long side of the body 110 perpendicular to the Z-axis direction is referred to as the "X-axis direction" (a first direction); the direction along the short side of the body 110 is referred to as the "Y-axis direction" (a second direction). Additionally in the following, the positive direction of the Z axis in the drawings is referred to as upper, and the negative direction is referred to as lower in some cases.

An orientation mark DM indicating the orientation of the filter device 100 is provided on an upper surface 111 (the dielectric layer LY1) of the body 110. The input terminal T1, the output terminal T2, and the ground terminal GND, which are external terminals to connect the filter device 100 to external devices, are arranged at a lower surface 112 (the dielectric layer LY6) of the body 110. The input terminal T1, the output terminal T2, and the ground terminal GND are plate-shaped electrodes. The input terminal T1, the output terminal T2, and the ground terminal GND are land grid array (LGA) connectors regularly arranged at the lower surface 112 of the body 110.

As described with reference to FIG. 2, the filter device 100 includes the LC parallel resonators RC1 to RC4 in four stages. More specifically, the resonator RC1 includes vias V10 and V11, a capacitor electrode P1, and a plate electrode PC1. The resonator RC2 includes vias V20 and V21, a capacitor electrode P2, and a plate electrode PC2. The resonator RC3 includes vias V30 and V31, a capacitor electrode P3, and a plate electrode PC34. The resonator RC4 includes a via V40, the via V31, a capacitor electrode P4, and the plate electrode PC34. The resonators RC3 and RC4 share the via V31 and the plate electrode PC34.

The capacitor electrode P1 of the resonator RC1 is provided in the dielectric layer LY4. When viewed in plan view in the normal direction (the Z-axis direction) of the body 110, a portion of the capacitor electrode P1 overlaps a ground electrode PG provided in the dielectric layer LY5. The capacitor electrode P1 and the ground electrode PG define the capacitor C1 in FIG. 2. The capacitor electrode P1 is coupled by a via VT11 to a plate electrode PT1 provided in the dielectric layer LY5. The plate electrode PT1 is coupled to the input terminal T1 by a via VT10.

The plate electrode PC1 of the resonator RC1 has an almost U-shape. As illustrated in FIG. 4, the plate electrode PC1 is positioned in the dielectric layer LY2 such that the opening of the U-shape is directed in the positive direction of the X axis. One end of the plate electrode PC1 is coupled to the capacitor electrode P1 by the via V10. The other end of the plate electrode PC1 is coupled to the ground electrode PG in the dielectric layer LY5 by the via V11. The ground electrode PG is coupled to the ground terminal GND by a plurality of vias VG. The plate electrode PC1 and the vias V10 and V11 define the inductor L1 in FIG. 2.

The capacitor electrode P2 of the resonator RC2 is provided in the dielectric layer LY4. When viewed in plan view in the normal direction of the body 110, a portion of the capacitor electrode P2 overlaps the ground electrode PG provided in the dielectric layer LY5. The capacitor electrode P2 and the ground electrode PG define the capacitor C2 in FIG. 2. The capacitor electrode P2 is coupled by a via VT21 to a plate electrode PT2 in the dielectric layer LY5. The plate electrode PT2 is coupled to the output terminal T2 by a via VT20.

Similarly to the plate electrode PC1, the plate electrode PC2 of the resonator RC2 has an almost U-shape. As illustrated in FIG. 4, the plate electrode PC2 is positioned in the dielectric layer LY2 such that the opening of the U-shape is directed in the negative direction of the X axis. In other words, in the dielectric layer LY2, the plate electrodes PC1 and PC2 are arranged adjacent to each other in the X-axis direction such that the openings of the plate electrodes PC1 are PC2 face each other. One end of the plate electrode PC2 is coupled to the capacitor electrode P2 by the via V20. The other end of the plate electrode PC2 is coupled to the ground electrode PG in the dielectric layer LY5 by the via V21. The plate electrode PC2 and the vias V20 and V21 define the inductor L2 in FIG. 2.

The capacitor electrode P3 of the resonator RC3 is provided in the dielectric layer LY4. When viewed in plan view in the normal direction of the body 110, a portion of the capacitor electrode P3 overlaps the ground electrode PG provided in the dielectric layer LY5. The capacitor electrode P3 and the ground electrode PG define the capacitor C3 in FIG. 2. The capacitor electrode P2 is coupled by the via V30 to the plate electrode PC34 provided in the dielectric layer LY2.

As illustrated in FIG. 4, the plate electrode PC34 has an almost T-shape. The plate electrode PC34 includes a first portion PC341 defining a strip-shaped electrode extended in the X-axis direction and a second portion PC342 elongated in the negative direction of the Y axis from the middle of the first portion PC341 in the X-axis direction. The first portion PC341 of the plate electrode PC34 is spaced apart from the plate electrodes PC1 and PC2 in the positive direction of the Y axis. The second portion PC342 of the plate electrode PC34 is elongated from the first portion PC341 toward the portion between the plate electrodes PC1 and PC2.

The via V30 is connected to a front end portion of the first portion PC341 in the negative direction of the X axis (a first end portion). The via V31 is connected to a front end portion of the second portion PC342 in the negative direction of the Y axis. The via V31 is connected to the ground electrode PG in the dielectric layer LY5. The inductor L3 in FIG. 2 is defined by the via V30 and a portion from the joint of the first portion PC341 with the via V30 to the second portion PC342. The second portion PC342 and the vias V31 and VG define the inductor L34 in FIG. 2.

The capacitor electrode P4 of the resonator RC4 is provided in the dielectric layer LY4. When viewed in plan view in the normal direction of the body 110, a portion of the capacitor electrode P4 overlaps the ground electrode PG provided in the dielectric layer LY5. The capacitor electrode P4 and the ground electrode PG define the capacitor C4 in FIG. 2. The capacitor electrode P4 is coupled by the via V40 to a front end portion (the second end portion) of the first portion PC341 of the plate electrode PC34 in the positive direction of the X axis. The inductor L4 in FIG. 2 is defined by the via V40 and a portion from the joint of the first portion PC341 with the via V40 to the second portion PC342.

The capacitor electrodes P12, P13, P24, and P34 are provided in the dielectric layer LY3. When viewed in plan view in the normal direction of the body 110, the capacitor electrode P12 partially overlaps the capacitor electrodes P1 and P2 in the dielectric layer LY4. The capacitor electrodes P1, P2, and P12 define the capacitor C12 in FIG. 2. When viewed in plan view in the normal direction of the body 110, the capacitor electrode P13 partially overlaps the capacitor electrodes P1 and P3 in the dielectric layer LY4. The capacitor electrodes P1, P3, and P13 define the capacitor C13 in FIG. 2.

When viewed in plan view in the normal direction of the body 110, the capacitor electrode P24 partially overlaps the capacitor electrodes P2 and P4 in the dielectric layer LY4. The capacitor electrodes P2, P4, and P24 define the capacitor C24 in FIG. 2. When viewed in plan view in the normal direction of the body 110, the capacitor electrode P34 partially overlaps the capacitor electrodes P3 and P4 in the dielectric layer LY4. The capacitor electrodes P3, P4, and P34 define the capacitor C34 in FIG. 2.

The ground-side vias V11 to V31 of the individual resonators are aligned in the X-axis direction. The via V31 shared by the resonators RC3 and RC4 is positioned between the via V11 of the resonator RC1 and the via V21 of the resonator RC2. The strength of magnetic coupling between the resonators can be controlled by changing the distance between the vias.

The inductance of the inductor L3 of the resonator RC3 and the inductance of the inductor L4 of the resonator RC3 can be controlled by changing the length (LG1 in FIG. 4) of the first portion PC341 and/or the width (W in FIG. 4) of the first portion PC341 of the plate electrode PC34. The inductance of the inductor L34 can be controlled by changing a length LG2 of the second portion PC342 of the plate electrode PC34.

In the following description, of the resonators, the vias coupled to the ground terminal GND with the capacitors interposed therebetween, namely the vias V10, V20, V30, and V40, are each referred to as a "first via". Of the resonators, the vias coupled to the ground terminal GND without the capacitors, namely the vias V11, V21, and V31, are each referred to as a "second via".

The multi-stage LC multilayer filter device as described above is used in a wide variety of communication devices such as smartphones, mobile phones, and also mobile phone base stations. For these communication devices, with the aim of improving the quality of communication and reducing power consumption in the devices, a need exists for further reduction in insertion loss in filter devices.

In the filter device 100 of the first preferred embodiment, the insertion loss is reduced by effectively positioning the resonators included in the filter device and also controlling the strength of magnetic coupling between the resonators. The following describes detailed features of the filter device 100 of the first preferred embodiment in comparison with the configuration of a known filter device.

Figure 5:
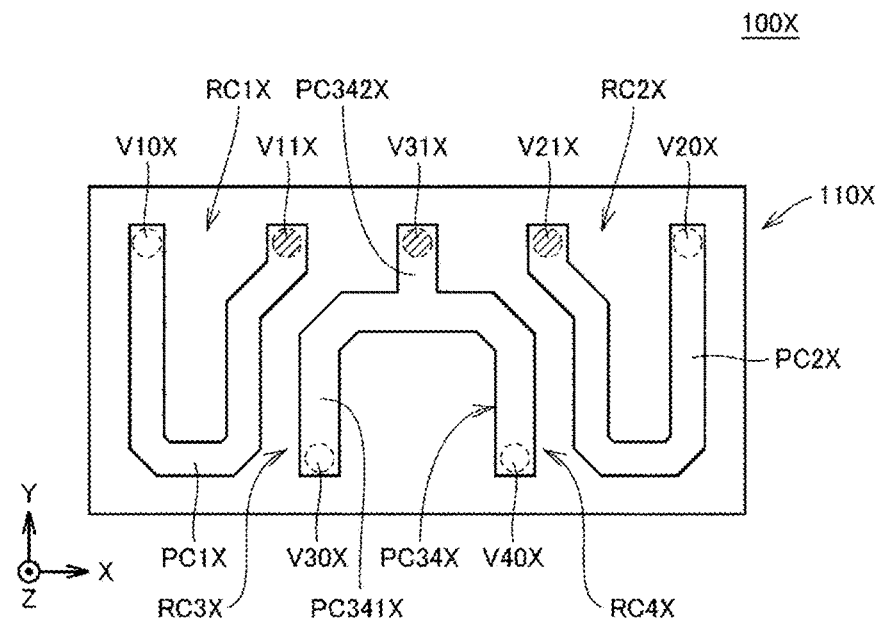
FIG. 5 is a plan view of a filter device of a comparative example.

FIG. 5 is a plan view of a dielectric layer including plate electrodes of resonators in a filter device 100X of a comparative example. In the filter device 100X, four resonators RC1X to RC4X are arranged in the X-axis direction.

Referring to FIG. 5, in the filter device 100X, the resonator RC1X is positioned near a front short side in the negative direction of the X axis in a body 110X, and the resonator RC2X is positioned near a front short side in the positive direction of the X axis in the body 110X. The resonators RC3X and RC4X are positioned between the resonators RC1X and RC2X.

The resonator RC1X includes a plate electrode PC1X and vias V10X and V11X. The plate electrode PC1X has an almost U-shape with an opening on the front side in the positive direction of the Y axis. The via V10X, which corresponds to the first via, is connected to one end of the plate electrode PC1X. The via V11X, which corresponds to the second via, is connected to the other end of the plate electrode PC1X.

The resonator RC2X includes a plate electrode PC2X and vias V20X and V21X. Similarly to the plate electrode PC1X, the plate electrode PC2X also has an almost U-shape with an opening on the front side in the positive direction of the Y axis. The via V20X, which corresponds to the first via, is connected to one end of the plate electrode PC2X. The via V21X, which corresponds to the second via, is connected to the other end of the plate electrode PC2X.

The resonator RC3X includes a plate electrode PC34X and vias V30X and V31X. The resonator RC4X includes the plate electrode PC34X, a via V40X, and the via V31X. This means that, similarly to the filter device 100 of the first preferred embodiment, the plate electrode of the resonator RC3X and the plate electrode of the resonator RC4X are structured in a combined manner, and the resonator RC3X and the resonator RC4X share the ground-side via V31X.

The plate electrode PC34X has an almost Y-shape. The plate electrode PC34X includes a first portion PC341X and a second portion PC342X; the first portion PC341X has a U-shape with an opening on the front side in the negative direction of the Y axis; the second portion PC342X is elongated from the middle of the first portion in the positive direction of the Y axis. V30X is connected to an end portion on the resonator RC1X side of the first portion PC341X, and V40X is connected to an end portion on the resonator RC2X side of the first portion PC341X. The shared via V31X is connected to the second portion PC342X.

Figure 6A:
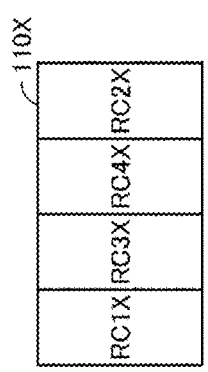
FIGS. 6A and 6B illustrate an arrangement of resonators of the filter device of the first preferred embodiment and an arrangement of resonators of the filter device of the comparative example.
Figure 6B:
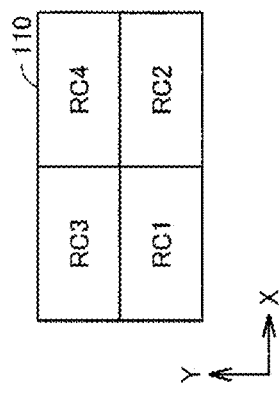

FIGS. 6A and 6B illustrate an arrangement of the resonators of the filter device 100 of the first preferred embodiment and an arrangement of the resonators of the filter device 100X of the comparative example. FIG. 6A illustrates an arrangement of the resonators of the filter device 100 in a simple manner, and FIG. 6B illustrates an arrangement of the resonators of the filter device 100X of the comparative example in a simple manner.

As illustrated in FIGS. 6A and 6B, in the filter device 100 of the first preferred embodiment, the input-side resonator RC1 and the output-side resonator RC2 are arranged adjacent to each other in the longitudinal direction of the body 110 (the X-axis direction), and the intermediate-stage resonators RC3 and RC4 are also adjacent to each other in the X-axis direction. The pair of the resonators RC1 and RC2 (a first resonator group) is adjacent to the pair of the resonators RC3 and RC4 (a second resonator group) in the Y-axis direction. By contrast, in the filter device 100X of the comparative example, the resonators RC1X, RC3X, RC4X, and RC2X are positioned in the order presented in the positive direction of the X axis of the body 110X.

In the filter device 100X of the comparative example, because the four resonators are one-dimensionally arranged, it is difficult to separate the conductors of the adjacent resonators by some distances. In particular, the intermediate-stage resonators RC3X and RC4X are between two resonators. As a result, if the distance to one resonator is increased, the distance to the other resonator is decreased. Thus, the Q factor cannot be increased with such an arrangement of resonators as the arrangement of the filter device 100X.

By contrast, in the filter device 100 of the first preferred embodiment, two resonators are arranged in the X-axis direction, and additionally, two resonators are arranged in the Y-axis direction. In other words, in the filter device 100, four resonators are two-dimensionally arranged. As a result, the distances between the adjacent resonators are increased by, for example, positioning the conductors of the resonators close to the outer periphery of the body 110. With this structure, although the area of the entire dielectric layer is the same, it is possible to increase the Q factor, thus reducing loss in the filter device.

Further, in the filter device 100 of the first preferred embodiment, the plate electrode PC34 of the intermediate-stage resonators RC3 and RC4 is linear as compared with the plate electrode PC34X of the filter device 100X of the comparative example. Usually, when a signal transfer path (that is, a current path) has a bend, current is likely to converge at the bend. Consequently, an increased amount of loss is caused at the portion at which current converges. The plate electrode PC34X of the comparative example has two bends in the path from the via V30X to the via V31X and the path from the via V40X to the via V31X. By contrast, the plate electrode PC34 of the first preferred embodiment has only one bend in each of the path from the via V30 to the via V31 and the path from the via V40 to the via V31. Also, in view of this point, the filter device 100 can reduce loss more than the filter device 100X of the comparative example.

Figure 7:
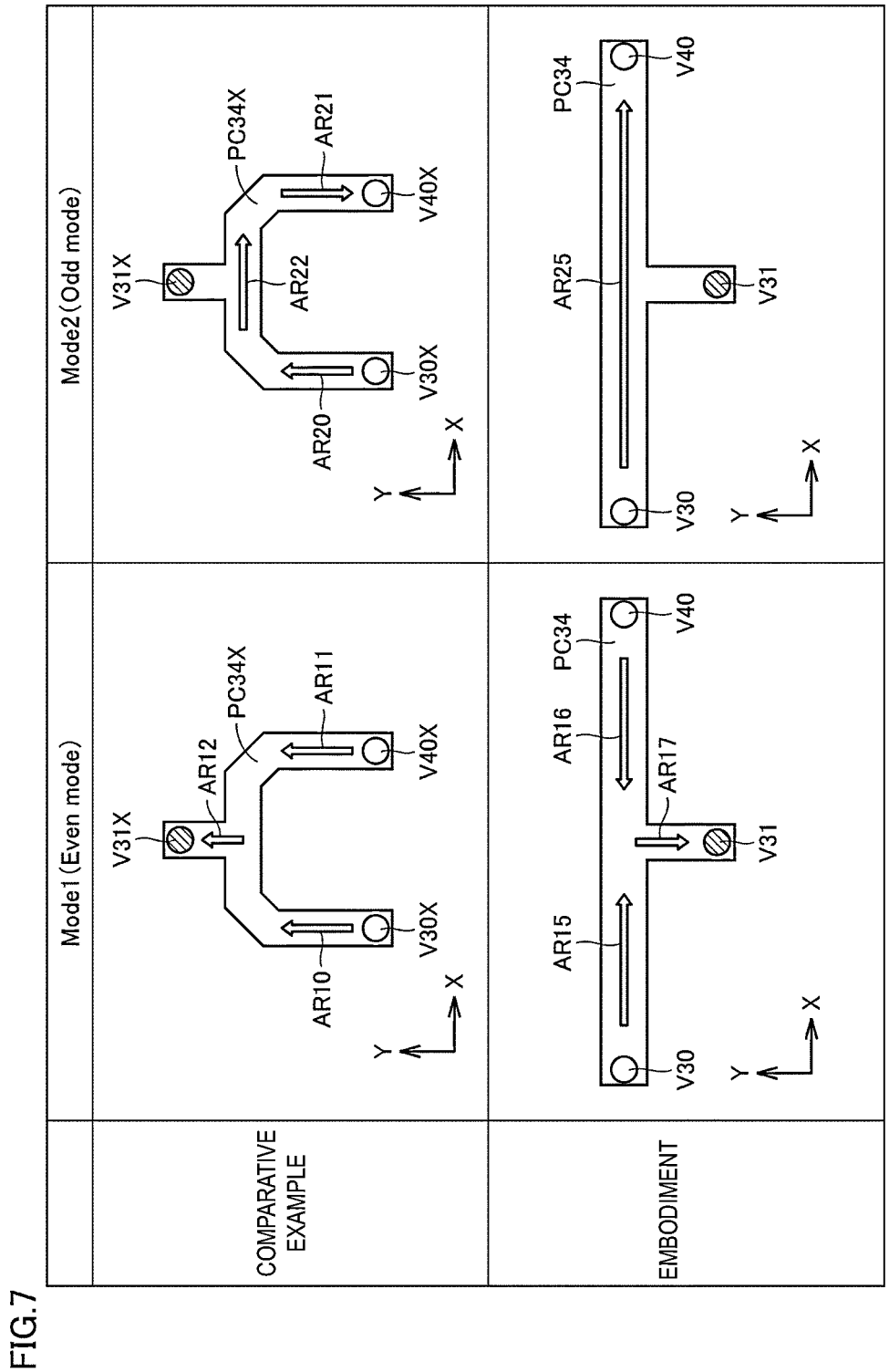
FIG. 7 illustrates the direction of current in the filter device of the first preferred embodiment of the present invention and the filter device of the comparative example in different modes.

Furthermore, the shape of the plate electrode PC34 of the first preferred embodiment has an advantage in which variations in characteristics are unlikely to occur, as compared with the plate electrode PC34X of the comparative example. FIG. 7 illustrates the direction of current in the filter device of the first preferred embodiment and the filter device of the comparative example in different modes. In FIG. 7, the upper row indicates cases of the comparative example, and the lower row indicates cases of the first preferred embodiment.

Referring to FIG. 7, when radio-frequency signals are transferred along two transfer paths, there are usually a first mode (Even Mode) in which current flows along the transfer paths in the same direction and a second mode (Odd Mode) in which current flows along the transfer paths in opposite directions. For example, in the case of the resonators RC3 and RC4 of the filter device 100, in the first mode, current flows from the via V30 to the via V31 in the resonator RC3, and from the via V40 to the via V31 in the resonator RC4. In the second mode, for example, current flows from the via V30 to the via V31 in the resonator RC3, and from the via V31 to the via V40 in the resonator RC4. In the second mode, the current flowing in the via V31 cancels out the current flowing from the via V31, and as a result, current flows from the via V30 to the via V40. The same holds for the filter device 100X of the comparative example.

Here, consideration is given to the case in which variations are caused in the shape of the plate electrode PC34 and the shape of the plate electrode PC34X in the process of manufacturing. In the comparative example, variations are often caused in the measurement of the U-shaped first portion of the plate electrode PC34X in the Y-axis direction and also in the position of the U-shaped first portion of the plate electrode PC34X. Also in this case, in the first mode, the path length of the current path including the vias in the resonator RC3X (the via V30X+arrows AR10 and AR12+ the via 31X) and the path length of the current path including the vias in the resonator RC4X (the via V40X+arrows AR11 and AR12+the via V31X) are little changed. However, in the second mode, the current path is the path indicated by arrows AR20, AR22, and AR21. As a result, when the measurement of the first portion in the Y-axis direction is changed, the path length from the via V30X to the via V40X are also changed. This can affect filter characteristics.

By contrast, in the filter device 100 of the first preferred embodiment, the path from the via V30 to the via V40 is a straight line. As a result, if variations are caused in the measurements of the plate electrode PC34, the path length of the current path in the first mode (arrows AR15 and AR17: arrows AR16 and AR17) and the path length of the current path in the second mode (arrow AR25) are little changed.

As described above, the effect of variations in the shape of plate electrode on filter characteristics is smaller in the filter device 100 of the first preferred embodiment than the filter device 100X of the comparative example.

Figure 8:
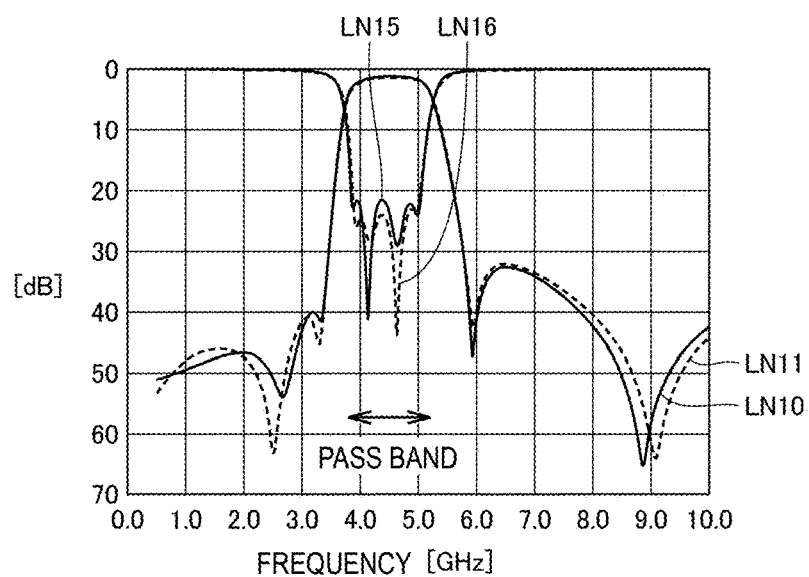
FIG. 8 illustrates bandpass characteristics of the filter device of the first preferred embodiment of the present invention and bandpass characteristics of the filter device of the comparative example.
Figure 9:
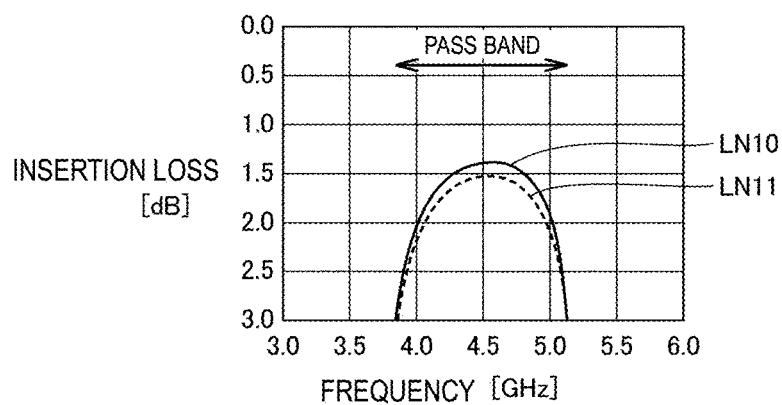
FIG. 9 is a partial enlargement of the graph of the insertion loss in FIG. 8.

FIG. 8 illustrates bandpass characteristics of the filter device 100 of the first preferred embodiment and bandpass characteristics of the filter device 100X of the comparative example. In FIG. 8, the horizontal axis indicates frequency, and the vertical axis indicates the insertion loss (LN10, LN11) and return loss (LN15, LN16) of the filter devices. Solid lines LN10 and LN15 indicate the case of the filter device 100 of the first preferred embodiment, and dashed lines LN11 and LN16 indicate the case of the filter device 100X of the comparative example. FIG. 9 is a partial enlargement of the graph of the insertion loss in FIG. 8.

Referring to FIGS. 8 and 9, the filter device 100 of the first preferred embodiment is almost the same as the filter device 100X of the comparative example with respect to the characteristic of return loss in the pass band (for example, about 3.8 to about 5.2 GHz) and the attenuation characteristic in the non-pass band. However, as illustrated in FIG. 9, the peak of insertion loss in the pass band is 1.52 dB in the filter device 100X of the comparative example, whereas the peak of insertion loss in the pass band is about 1.37 dB in the filter device 100 of the first preferred embodiment. This means that the peak of insertion loss is decreased by about 10%.

As described above, in the filter device including four resonators, the conductors are separated by some distances by two-dimensionally arranging the resonators. Additionally, magnetic coupling is made strong by configuring a portion of the intermediate-stage resonators in a shared manner, thus increasing the Q factor. As a result, it is possible to reduce loss in the filter device.

First to Third Modifications

The following describes first to third modifications in which the shape of the plate electrode of the resonators RC3 and RC4 is different in the dielectric layer LY2 in the body 110.

First Modification

Figure 10:
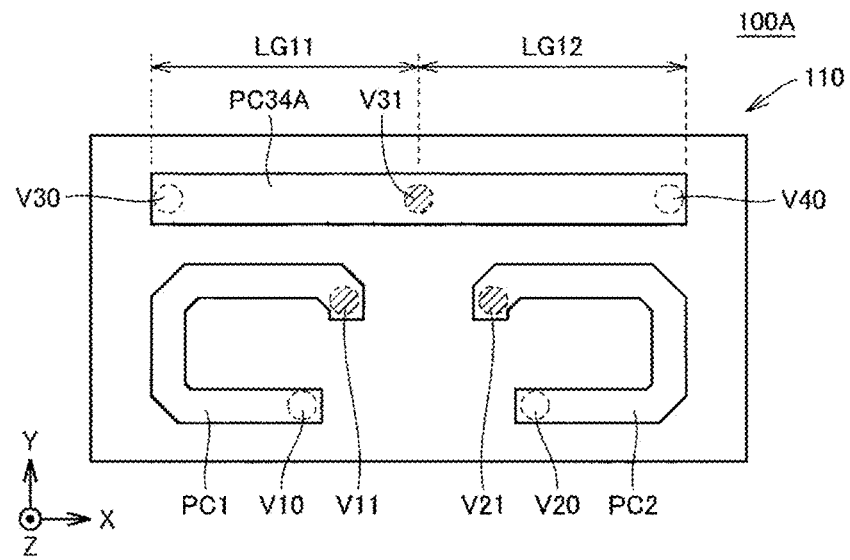
FIG. 10 is a plan view of a filter device of a first modification of a preferred embodiment of the present invention.

FIG. 10 is a plan view of a filter device 100A of the first modification. Referring to FIG. 10, in the filter device 100A, the plate electrode PC34 in the dielectric layer LY2 of the filter device 100 illustrated in FIG. 3 is replaced with a plate electrode PC34A. The plate electrode PC34A is a strip-shaped electrode corresponding to the first portion PC341 of the plate electrode PC34. In other words, the plate electrode PC34A has a shape formed by removing the second portion PC342 from the plate electrode PC34.

The shared via V31 connected to the ground electrode PG is connected to the plate electrode PC34A between the via V30 connected to the first end portion and the via V40 connected to the second end portion. In the filter device 100A, by controlling a distance LG11 between the vias V30 and V31 and a distance LG12 between the vias V40 and V31, the inductance value of the inductor L3 of the resonator RC3 and the inductance value of the inductor L4 of the resonator RC4 can be controlled.

Figure 11:
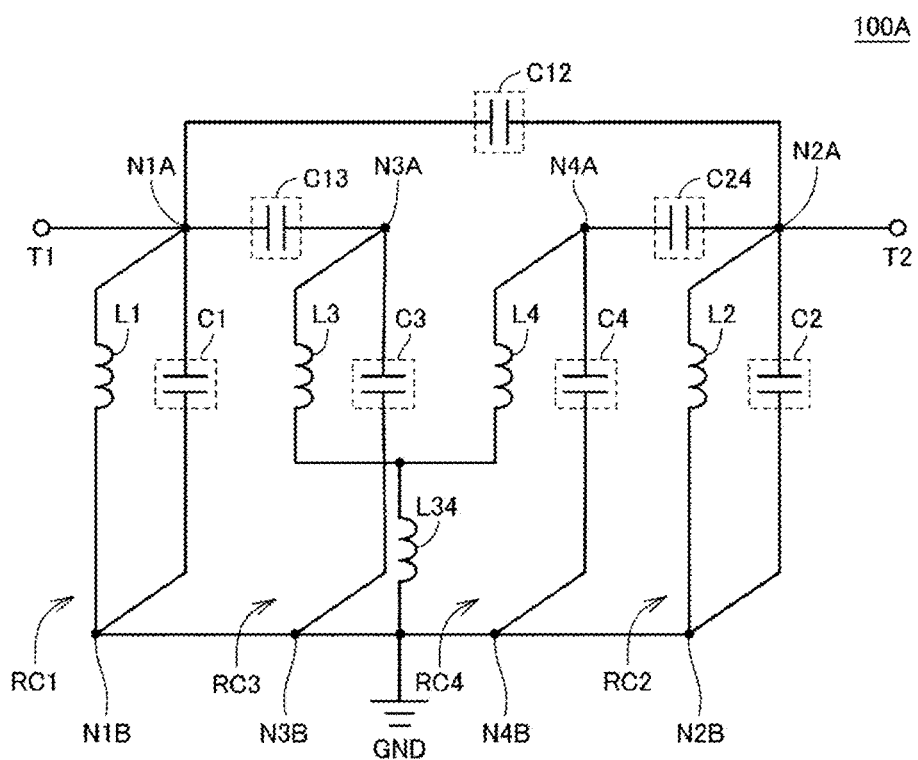
FIG. 11 is an equivalent circuit diagram of the filter device in FIG. 10.

FIG. 11 is an equivalent circuit diagram of the filter device 100A in FIG. 10. In the filter device 100A, as described above, the position of the via V31 is moved in the positive direction of the Y axis, when compared with the filter device 100. Together with this change, the capacitor electrode P34 in the dielectric layer LY3 in FIG. 3 is removed. As a result, as illustrated as the equivalent circuit in FIG. 11, the circuit of the filter device 100A is configured such that the capacitor C34 between the connection node N3A of the resonator RC3 and the connection node N4A of the resonator RC4 is removed from the equivalent circuit in FIG. 3.

Also in such a filter device 100A, the resonators RC3 and RC4 are positioned parallel to the arrangement direction of the resonators RC1 and RC2, and the resonators RC3 and RC4 partially share a path to the ground terminal. This increases the Q factor of the filter device, and as a result, the loss characteristic of the filter device is improved.

In the filter device 100 of the first preferred embodiment, the shared via V31 is positioned between the via V11 of the resonator RC1 and the via V21 of the resonator RC2. As a result, magnetic coupling between the resonator RC1 and the resonators RC3 and RC4 and magnetic coupling between the resonator RC2 and the resonators RC3 and RC4 are relatively strong, whereas magnetic coupling between the resonators RC1 and RC4 is slightly weak due to the effect of the via V31.

By contrast, in the structure of the filter device 100A of the first modification, the shared via V31 is positioned more forward in the positive direction of the Y axis than the filter device 100 of the first preferred embodiment. As a result, magnetic coupling between the resonator RC1 and the resonators RC3 and RC4 and magnetic coupling between the resonator RC2 and the resonators RC3 and RC4 are weaker than the filter device 100 of the first preferred embodiment. However, because the shared via V31 is not positioned between the via V11 of the resonator RC1 and the via V12 of the resonator RC2, magnetic coupling between the resonators RC1 and RC4 is stronger than the filter device 100.

This means that the strength of magnetic coupling between resonators can be controlled by changing the position of the shared via V31 in the Y-axis direction.

Second Modification

Figure 12:
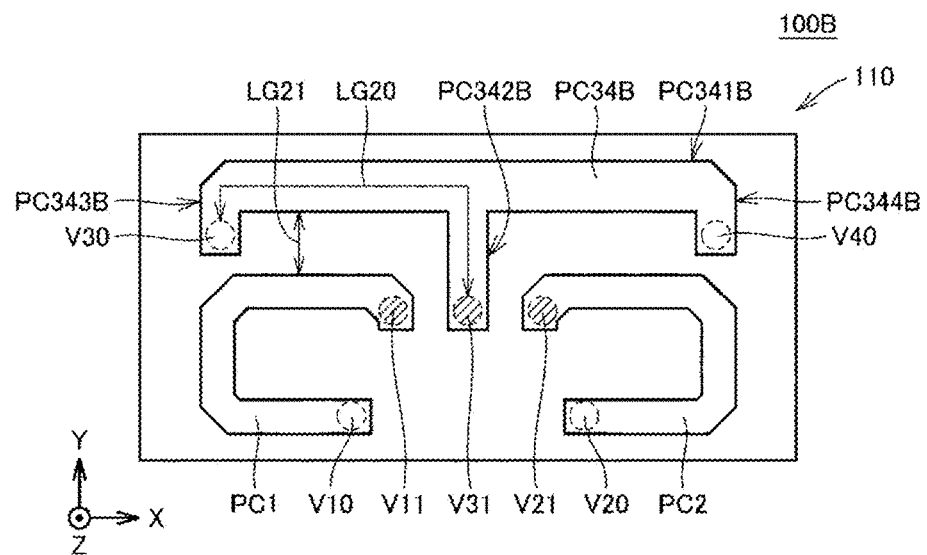
FIG. 12 is a plan view of a filter device of a second modification of a preferred embodiment of the present invention.

FIG. 12 is a plan view of a filter device 100B of the second modification. Referring to FIG. 12, in the filter device 100B, the plate electrode PC34 in the dielectric layer LY2 of the filter device 100 is replaced with a plate electrode PC34B. The plate electrode PC34B has an almost E-shape. The plate electrode PC34B includes a first portion PC341B and three elongated portions (a second portion PC342B, a third portion PC343B, and a fourth portion PC344B). The first portion PC341B is a strip-shaped electrode extended in the X-axis direction. The second portion PC342B, the third portion PC343B, and the fourth portion PC344B are elongated from the first portion PC341B in the negative direction of the Y axis.

More specifically, the second portion PC342B is elongated from the middle of the first portion PC341B in the extension direction (the X-axis direction) of the first portion PC341B to a space between the plate electrodes PC1 and PC2. The third portion PC343B is elongated from a front end portion of the first portion PC341B in the negative direction of the X axis (the first end portion) toward the plate electrode PC1. The fourth portion PC344B is elongated from a front end portion of the first portion PC341B in the positive direction of the X axis (the second end portion) toward the plate electrode PC2.

The via V30 of the resonator RC3 is connected to the third portion PC343B. The via V40 of the resonator RC4 is connected to the fourth portion PC344B. The shared via V31 connected to the ground electrode PG is positioned at the second portion PC342B.

With this structure, the distance between the vias V30 and V31 and the distance between the vias V40 and V31 (each corresponds to an arrow LG20) in the resonators RC3 and RC4 are made longer than the filter device 100. By doing this, it is possible to control the inductor of the inductor L3 of the resonator RC3, the inductor of the inductor L4 of the resonator RC4, and the inductor of the shared inductor L34.

Further, this structure makes the distance between the first portion PC341B of the plate electrode PC34B and the plate electrode PC1 and the distance between the first portion PC341B of the plate electrode PC34B and the plate electrode PC2 (each corresponds to an arrow LG21) wider. As a result, magnetic coupling between the resonators RC1 and RC3 and magnetic coupling between the resonators RC2 and RC4 are made weaker than the filter device 100 of the first preferred embodiment.

Also in such a filter device 100B, the resonators RC3 and RC4 are positioned parallel to the arrangement direction of the resonators RC1 and RC2, and a portion of the path to the ground terminal is shared by the resonators RC3 and RC4. This increases the Q factor of the filter device, and as a result, the loss characteristic of the filter device is improved.

Third Modification

Figure 13:
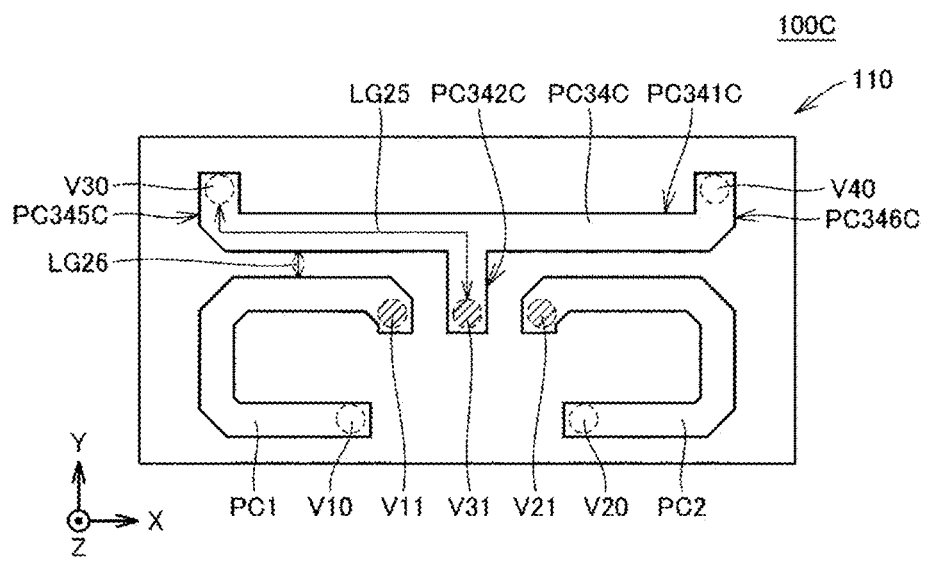
FIG. 13 is a plan view of a filter device of a third modification of a preferred embodiment of the present invention.

FIG. 13 is a plan view of a filter device 100C of the third modification. Referring to FIG. 13, in the filter device 100C, the plate electrode PC34 in the dielectric layer LY2 of the filter device 100 is replaced with a plate electrode PC34C. The plate electrode PC34C has an almost Y-shape. The plate electrode PC34C includes a first portion PC341C and three elongated portions (a second portion PC342C, a fifth portion PC345C, and a sixth portion PC346C). The first portion PC341C is a strip-shaped electrode extended in the X-axis direction. The second portion PC342C, the fifth portion PC345C, and the sixth portion PC346C are elongated from the first portion PC341C in the Y-axis direction.

More specifically, the second portion PC342C is elongated from the middle of the first portion PC341C in the extension direction (the X-axis direction) of the first portion PC341C to a space between the plate electrodes PC1 and PC2. The fifth portion PC345C is elongated from a front end portion of the first portion PC341C in the negative direction of the X axis (the first end portion) toward the side opposite to the plate electrode PC1 (in the positive direction of the Y axis). The sixth portion PC346C is elongated from a front end portion of the first portion PC341C in the positive direction of the X axis (the second end portion) toward the side opposite to the plate electrode PC2 (in the positive direction of the Y axis).

The via V30 of the resonator RC3 is connected to the fifth portion PC345C. The via V40 of the resonator RC4 is connected to the sixth portion PC346C. The shared via V31 connected to the ground electrode PG is positioned at the second portion PC342C.

With this structure, the distance between the vias V30 and V31 and the distance between the vias V40 and V31 (each corresponds to an arrow LG25) in the resonators RC3 and RC4 are longer than the filter device 100. By doing this, it is possible to control the inductor of the inductor L3 of the resonator RC3, the inductor of the inductor L4 of the resonator RC4, and the inductor of the shared inductor L34.

Further, this structure makes the distance between the first portion PC341C of the plate electrode PC34C and the plate electrode PC1 and the distance between the first portion PC341C of the plate electrode PC34C and the plate electrode PC2 (each corresponds to an arrow LG26) narrower. As a result, magnetic coupling between the resonators RC1 and RC3 and magnetic coupling between the resonators RC2 and RC4 are made stronger than the filter device 100 of the first preferred embodiment.

Also in such a filter device 100C, the resonators RC3 and RC4 are positioned parallel to the arrangement direction of the resonators RC1 and RC2, and a portion of the path to the ground terminal is shared by the resonators RC3 and RC4. This increases the Q factor of the filter device, and as a result, the loss characteristic of the filter device is improved.

Fourth to Sixth Modifications

The following describes fourth to sixth modifications in which magnetic coupling between resonators are changed.

Fourth Modification

Figure 14:
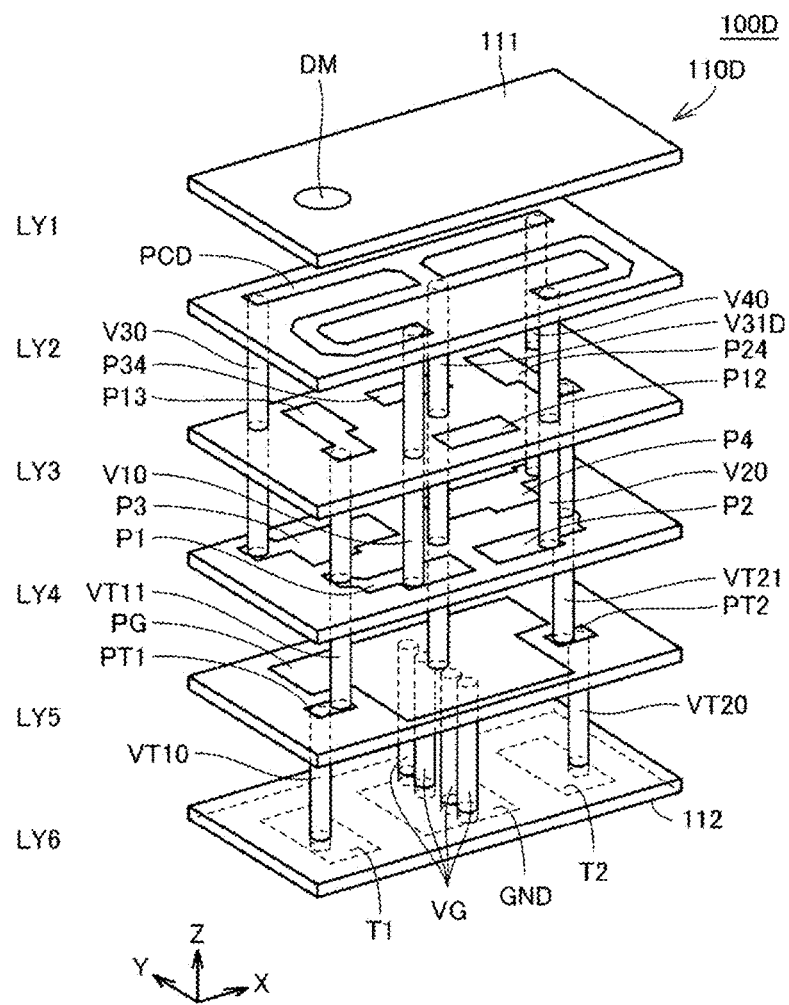
FIG. 14 is an exploded perspective view illustrating an example of a layered structure of a filter device of a fourth modification of a preferred embodiment of the present invention.

FIG. 14 is an exploded perspective view illustrating an example of a layered structure of a filter device 100D of the fourth modification. In the filter device 100D, plate electrodes of resonators in the dielectric layer LY2 of a body 110D are combined as a plate electrode PCD. More specifically, the plate electrode PCD is structured such that the end portion of the plate electrode PC1 connected to the via V11 of the resonator RC1 and the end portion of the plate electrode PC2 connected to the via V21 of the resonator RC2 in FIG. 4 of the first preferred embodiment are connected to the second portion PC342 of the plate electrode PC34 defining the resonators RC3 and RC4. This means that the via V11 of the resonator RC1, the via V21 of the resonator RC2, and the via V31 of the resonators RC3 and RC4 are structured as a single via V31D in a shared manner. The via V31D connects the plate electrode PCD in the dielectric layer LY2 to the ground electrode PG in the dielectric layer LY5. The other structural portions are the same as the filter device 100 illustrated in FIG. 3, and descriptions of the same elements are not repeated.

In the filter device 100D, the four resonators RC1 to RC4 are coupled to each other by sharing the via V31D. This structure makes magnetic coupling between the resonators stronger than the filter device 100 of the first preferred embodiment, and as a result, the Q factor of the filter device is further improved. Consequently, the loss characteristic of the filter device can be improved.

Fifth Modification

Figure 15:
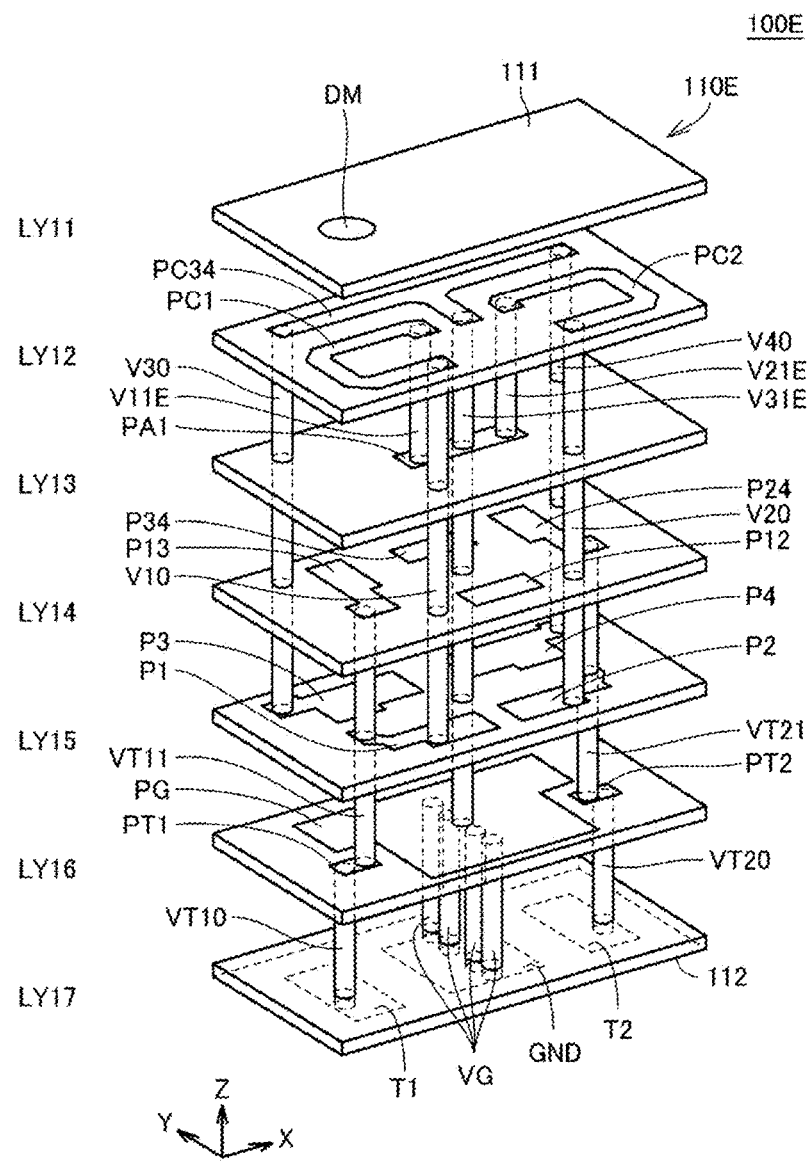
FIG. 15 is an exploded perspective view illustrating an example of a layered structure of a filter device of a fifth modification of a preferred embodiment of the present invention.

FIG. 15 is an exploded perspective view illustrating an example of a layered structure of a filter device 100E of the fifth modification. The filter device 100E basically has a structure between the filter device 100 of the first preferred embodiment illustrated in FIG. 3 and the filter device 100D of the fourth modification illustrated in FIG. 14. The vias of the resonators, leading to the ground terminal GND, are combined together at a layer lower than the dielectric layer having the plate electrodes.

The following describes details with reference to FIG. 15. In FIG. 15, the same elements as the filter device 100 in FIG. 3 are assigned the same reference numerals.

The filter device 100E has a rectangular or almost rectangular solid body 110E including a plurality of dielectric layers LY11 to LY17 that are stacked in a given direction. An orientation mark DM indicating the orientation of the filter device 100E is provided on an upper surface 111 (the dielectric layer LY11) of the body 110E. The input terminal T1, the output terminal T2, and the ground terminal GND, which are external terminals to connect the filter device 100E to external devices, are arranged at a lower surface 112 (the dielectric layer LY17) of the body 110E.

Similarly to the filter device 100 of the first preferred embodiment, the filter device 100E includes the LC parallel resonators RC1 to RC4 in four stages. The resonator RC1 includes the via V10, a via V11E, the capacitor electrode P1, and the plate electrode PC1. The resonator RC2 includes the via V20, a via V21E, the capacitor electrode P2, and the plate electrode PC2. The resonator RC3 includes the via V30, a via V31E, the capacitor electrode P3, and the plate electrode PC34. The resonator RC4 includes the via V40, the via V31E, the capacitor electrode P4, and the plate electrode PC34. The resonators RC3 and RC4 share the via V31E and the plate electrode PC34.

Similarly to the filter device 100, the plate electrode PC1 included in the resonator RC1, the plate electrode PC2 included in the resonator RC2, and the plate electrode PC34 shared by the resonators RC3 and RC4 are provided in the dielectric layer LY12.

A plate electrode PA1 defining a strip-shaped electrode extended in the X-axis direction is provided in the dielectric layer LY13. The via V11E of the resonator RC1 is connected to the plate electrodes PC1 and PA1. The via V12E of the resonator RC2 is connected to the plate electrodes PC2 and PA1. The via V31E shared by the resonators RC3 and RC4 is elongated from the plate electrode PC34 through the plate electrode PA1 and connected to the ground electrode PG provided in the dielectric layer LY16. In other words, the via V11E of the resonator RC1 and the via V21E of the resonator RC2 are combined with the via V31E of the resonators RC3 and RC4 by the plate electrode PA1.

The structures from the dielectric layers LY14 to LY17 respectively correspond to the structures of the dielectric layers LY3 to LY6 of the filter device 100 in FIG. 3 except for the shared via V31E. Detailed descriptions of the dielectric layers LY14 to LY17 are thus not repeated.

As described above, in the filter device 100E of the fifth modification, a portion of the path from the plate electrode of the resonator RC1 in the dielectric layer LY12 to the ground electrode PG and a portion of the path from the plate electrode of the resonator RC2 in the dielectric layer LY12 to the ground electrode PG are collectively implemented by the via V31E of the resonators RC3 and RC4 in a shared manner. This structure can make magnetic coupling between the resonators stronger than the filter device 100 of the first preferred embodiment. As a result, as compared to the filter device 100 of the first preferred embodiment, the Q factor of the filter device is increased, and the loss characteristic of the filter device is improved.

Magnetic coupling between the resonators of the filter device 100E is weaker than magnetic coupling between the resonators of the filter device 100D of the fourth modification. This means that by changing the level (the dielectric layer) at which ground-side vias of the resonators are combined in a shared manner, it is possible to make fine adjustments to magnetic coupling between the resonators.

Sixth Modification

Figure 16:
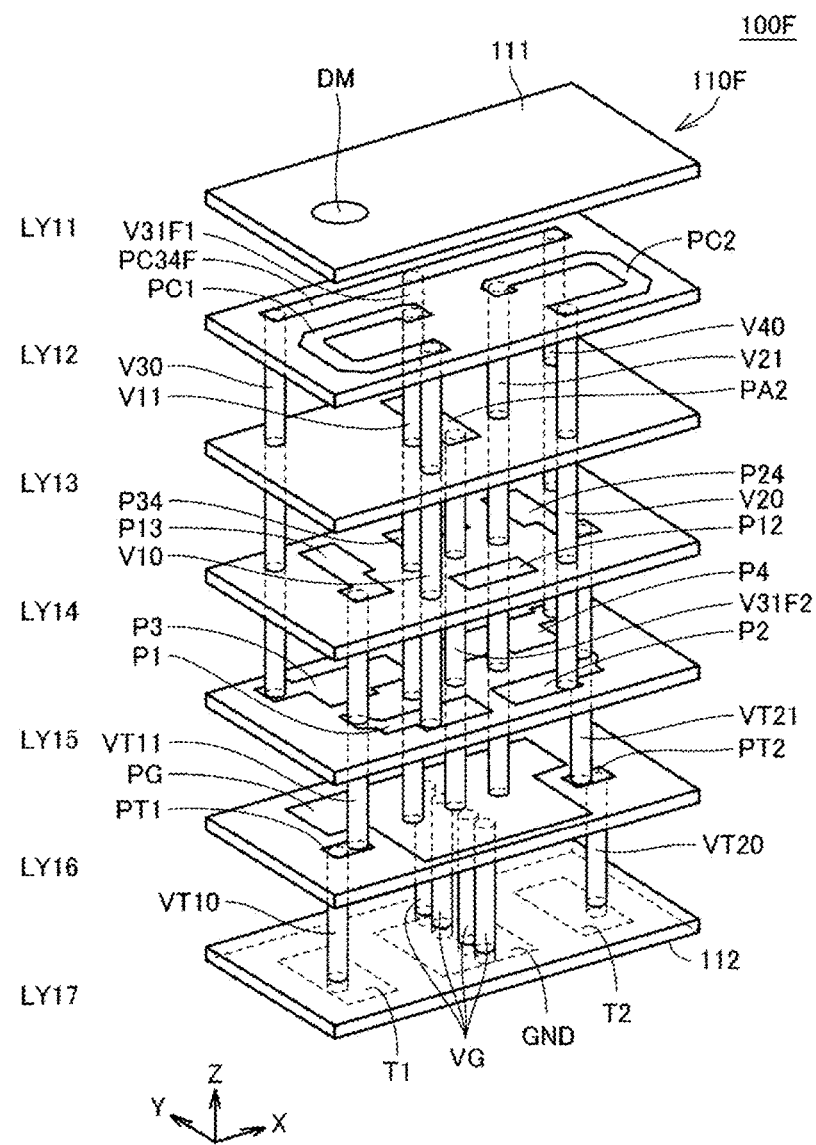
FIG. 16 is an exploded perspective view illustrating an example of a layered structure of a filter device of a sixth modification of a preferred embodiment of the present invention.

FIG. 16 is an exploded perspective view illustrating an example of a layered structure of a filter device 100F of the sixth modification. The filter device 100F basically has a structure in which the second portion PC342 of the plate electrode PC34 of the filter device 100 of the first preferred embodiment illustrated in FIG. 3 is provided in a layer different from the layer having the first portion PC341.

The following describes details with reference to FIG. 16. In the dielectric layer LY12 of a body 110F, a plate electrode PC34F shared by the resonators RC3 and RC4 is a strip-shaped electrode extending in the X-axis direction, similarly to the filter device 100A in FIG. 10. A plate electrode PA2 is a strip-shaped electrode extended in the Y-axis direction and provided in the dielectric layer LY13.

A ground-side via V31F1 shared by the resonators RC3 and RC4 is connected to the middle of the plate electrode PC34F and one end of the plate electrode PA2. The other end of the plate electrode PA2 is coupled to the ground electrode PG in the dielectric layer LY16 by a via V31F2. In other words, in the filter device 100F, the ground-side via shared by the resonators RC3 and RC4 is repositioned at the level (the dielectric layer LY13) different from the level of the plate electrode PC34F (the dielectric layer LY12).

Similarly to the via V31 in FIG. 3, the via V31F2 elongated from the dielectric layer LY13 to the dielectric layer LY16 is positioned between the via V11 of the resonator RC1 and the via V12 of the resonator RC2. The via V31F2 of the filter device 100F is shorter than the via V31 of the filter device 100 of the first preferred embodiment, and the portions facing the via V31F2 in the filter device 100F are smaller than in the filter device 100. As a result, magnetic coupling between the resonators RC1 and RC2 and the resonators RC3 and RC4 is weaker than the filter device 100.

Conversely, because the via V31F2 is shorter than the vias V11 and V21, a portion of the via V11 and a portion of the via V21 directly face each other. As a result, magnetic coupling between the resonators RC1 and RC2 is stronger than the filter device 100.

As described above, in the filter device 100F of the sixth modification, the ground-side via shared by the intermediate-stage resonators RC3 and RC4 is repositioned in the middle of the ground-side via in the extension direction, so that magnetic coupling between the resonators is changed.

Seventh to Ninth Modifications

The following describes seventh to ninth modifications in which the input impedance of the resonator RC1 coupled to the input terminal T1 and the output impedance of the resonator RC2 coupled to the output terminal T2 are increased, thus achieving size reduction and characteristic improvement.

Seventh Modification

Figure 17:
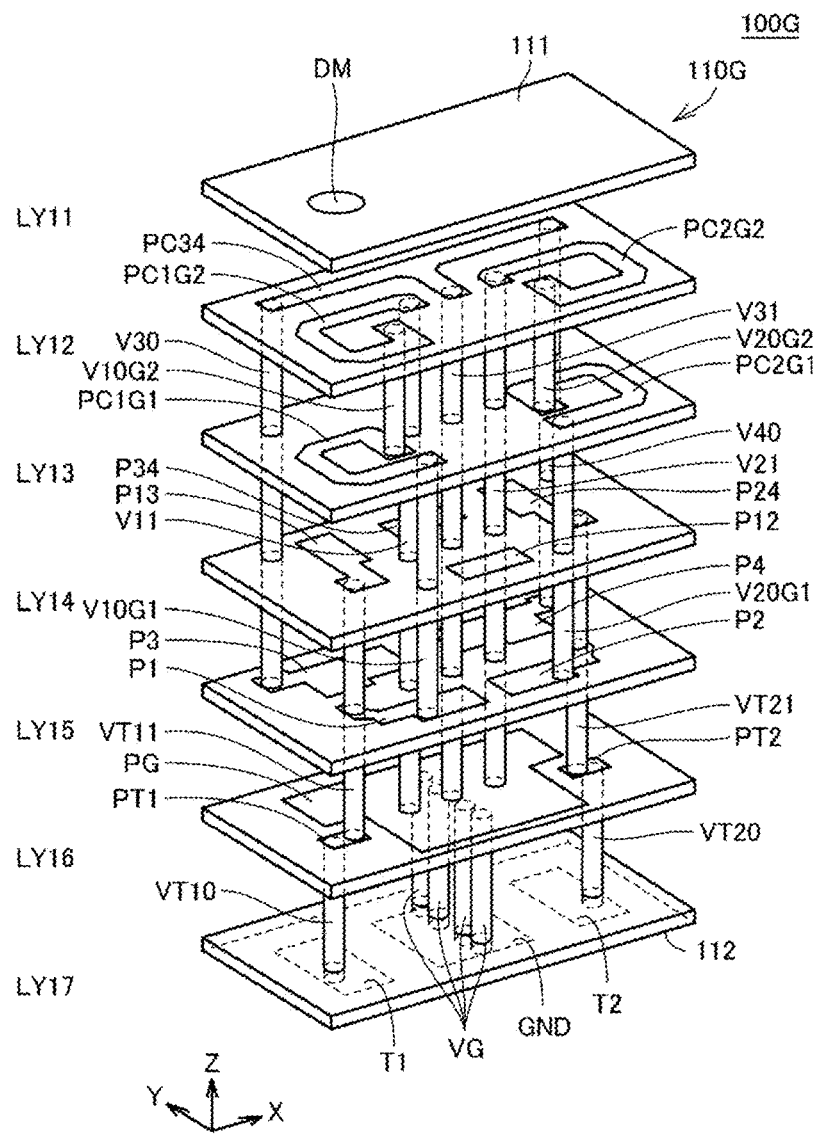
FIG. 17 is an exploded perspective view illustrating an example of a layered structure of a filter device of a seventh modification of a preferred embodiment of the present invention.

FIG. 17 is an exploded perspective view illustrating an example of a layered structure of a filter device 100G of the seventh modification. The filter device 100G basically has a structure in which the plate electrode PC1 of the input-side resonator RC1 and the plate electrode PC2 of the output-side resonator RC2 of the filter device 100 of the first preferred embodiment are implemented by compound coils. The structures of the dielectric layers LY14 to LY17 in FIG. 17 respectively correspond to the dielectric layers LY3 and LY6 of the filter device 100 in FIG. 3, and detailed descriptions of the dielectric layers LY14 to LY17 are not repeated.

Referring to FIG. 17, a plate electrode PC1G2 defining a portion of the resonator RC1, a plate electrode PC2G2 defining a portion of the resonator RC2, and the plate electrode PC34 defining a portion of the resonators RC3 and RC4 are provided in the dielectric layer LY12 of a body 110G. A plate electrode PC1G1 and a plate electrode PC2G1 are provided in the dielectric layer LY13. The plate electrodes PC1G1, PC1G2, PC2G1, and PC2G2 are shaped in loops wound around a winding axis in the layer direction (the Z-axis direction).

One end of the plate electrode PC1G2 is coupled to the ground electrode PG provided in the dielectric layer LY16 by the via V11. The other end of the plate electrode PC1G2 is coupled to one end of the plate electrode PC1G1 in the dielectric layer LY13 by the via V10G2. The other end of the plate electrode PC1G1 is coupled to the capacitor electrode P1 in the dielectric layer LY15 by the via V10G1. The plate electrodes PC1G1 and PC1G2 and the via V10G2 define a compound coil, the winding direction of which is the Z-axis direction. This structure increases the inductance of the inductor L1 including the vias V10G1, V10G2, and V11 and the plate electrodes PC1G1 and PC1G2, and as a result, the impedance of the resonator RC1 (that is, the input impedance of the filter device 100F) is increased.

One end of the plate electrode PC2G2 is coupled to the ground electrode PG provided in the dielectric layer LY16 by the via V21. The other end of the plate electrode PC2G2 is coupled to one end of the plate electrode PC2G1 in the dielectric layer LY13 by a via V20G2. The other end of the plate electrode PC2G1 is coupled to the capacitor electrode P2 in the dielectric layer LY15 by a via V20G1. The plate electrodes PC2G1 and PC2G2 and the via V20G2 define a compound coil, the winding direction of which is the Z-axis direction. This structure increases the inductance of the inductor L2 defined by the vias V20G1, V20G2, and V21 and the plate electrodes PC2G1 and PC2G2, and as a result, the impedance of the resonator RC2 (that is, the output impedance of the filter device 100F) is increased.

By increasing the input/output impedance, the degree of coupling with an external device coupled to the filter is increased, and as a result, the Q factor is decreased with respect to the external device. Accordingly, it is possible to achieve reduction of return loss in the pass band and wider bandwidth.

Eighth Modification

In the seventh modification, the structure in which the input/output impedance is increased by compound coils wound around a winding axis in the layer direction (the Z-axis direction) is described. In the eighth modification, the structure in which the input/output impedance is increased by compound coils wound around a winding axis in the direction perpendicular to the layer direction will be described.

Figure 18:
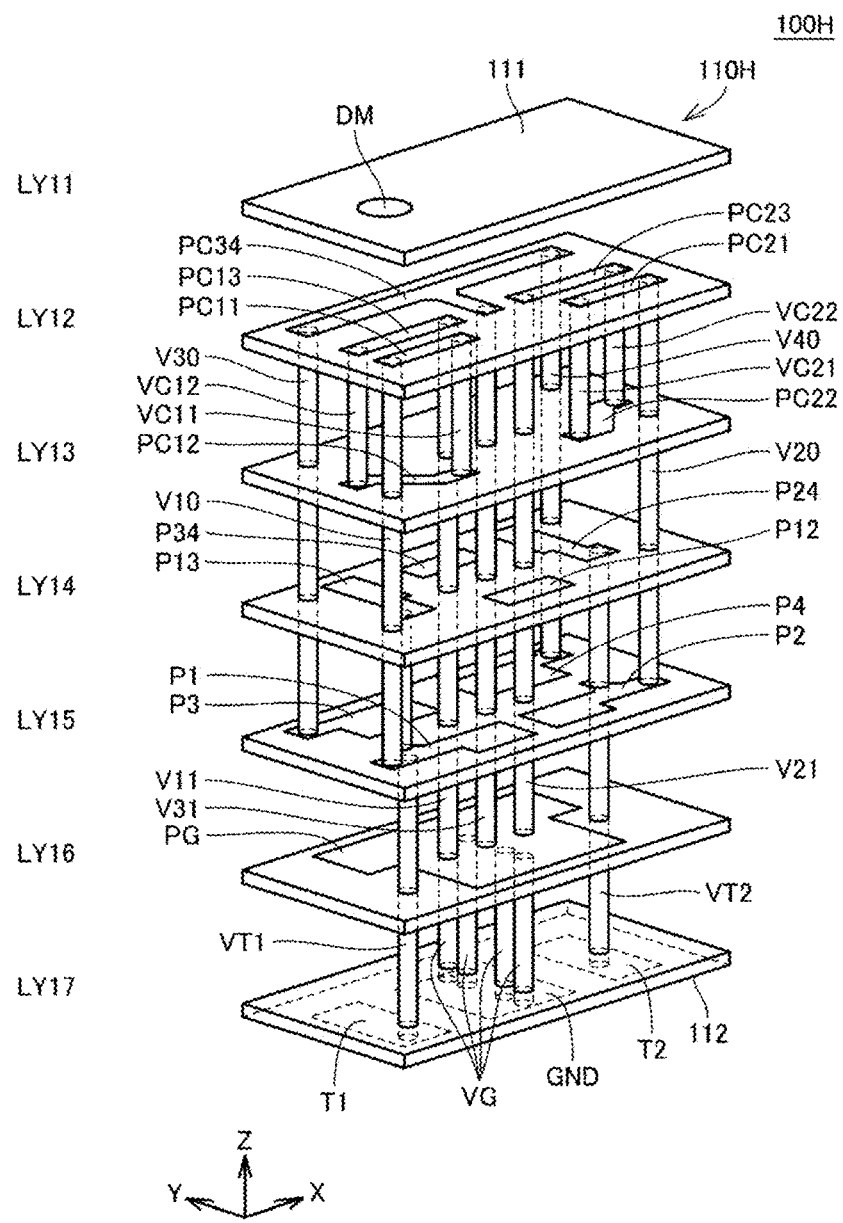
FIG. 18 is an exploded perspective view illustrating an example of a layered structure of a filter device of an eighth modification of a preferred embodiment of the present invention.

FIG. 18 is an exploded perspective view illustrating an example of a layered structure of a filter device 100H of the eighth modification. Plate electrodes PC11 and PC13 defining a portion of the resonator RC1, plate electrodes PC21 and PC23 defining a portion of the resonator RC2, and the plate electrode PC34 defining a portion of the resonators RC3 and RC4 are provided in the dielectric layer LY12 of a body 110H. A plate electrode PC12 and a plate electrode PC22 are provided in the dielectric layer LY13. Regarding the filter device 100H in FIG. 18, redundant descriptions of the same elements as FIG. 17 are not repeated.

The plate electrodes PC11, PC13, PC21, and PC23 are strip-shaped electrodes extended in the X-axis direction. The plate electrodes PC11 and PC13 are parallel or substantially parallel to each other and positioned in a region more forward than the second portion PC342 of the plate electrode PC34 in the negative direction of the X axis. The plate electrodes PC21 and PC23 are parallel or substantially parallel to each other and positioned in a region more forward than the second portion PC342 in the positive direction of the X axis.

A front end portion of the plate electrode PC11 in the negative direction of the X axis is coupled to the capacitor electrode P1 in the dielectric layer LY15 by the via V10. A front end portion of the plate electrode PC11 in the positive direction of the X axis is coupled by a via VC11 to one end of the plate electrode PC12 provided in the dielectric layer LY13. The other end of the plate electrode PC12 is coupled by a via VC12 to a front end portion of the plate electrode PC12 in the negative direction of the X axis. A front end portion of the plate electrode PC12 in the positive direction of the X axis is coupled to the ground electrode PG in the dielectric layer LY16 by the via V11. The plate electrodes PC11 to PC13 and the vias VC11 and VC12 define a compound coil, the winding direction of which is the Y-axis direction. This structure increases the inductance of the inductor L1 defined by the vias V10, V11, VC11, and VC12 and the plate electrodes PC11 to PC13, and as a result, the input impedance of the filter device 100H is increased.

A front end portion of the plate electrode PC21 in the positive direction of the X axis is coupled to the capacitor electrode P2 in the dielectric layer LY15 by the via V20. A front end portion of the plate electrode PC21 in the negative direction of the X axis is coupled by a via VC21 to one end of the plate electrode PC22 provided in the dielectric layer LY13. The other end of the plate electrode PC22 is coupled by a via VC22 to a front end portion of the plate electrode PC22 in the positive direction of the X axis. A front end portion of the plate electrode PC22 in the negative direction of the X axis is coupled to the ground electrode PG in the dielectric layer LY16 by the via V21. The plate electrodes PC21 to PC23 and the vias VC21 and VC22 define a compound coil, the winding direction of which is the Y-axis direction. This structure increases the inductance of the inductor L2 defined by the vias V20, V21, VC21, and VC22 and the plate electrodes PC21 to PC23, and as a result, the output impedance of the filter device 100H is increased.

With reference to FIG. 18, the description is made for the case in which compound coils of the resonators RC1 and RC2 are wound around winding axes in the Y-axis direction. However, it is sufficient that the direction of winding axis be perpendicular to the Z-axis direction. For example, the coils may be wound around winding axes in the X-axis direction.

The structure of the filter device 100G of the eighth modification also increases the input/output impedance, and thus, it is possible to achieve lower resonant frequency, size reduction of the filter device, reduction of return loss in the pass band, and wider bandwidth.

Ninth Modification

Figure 19:
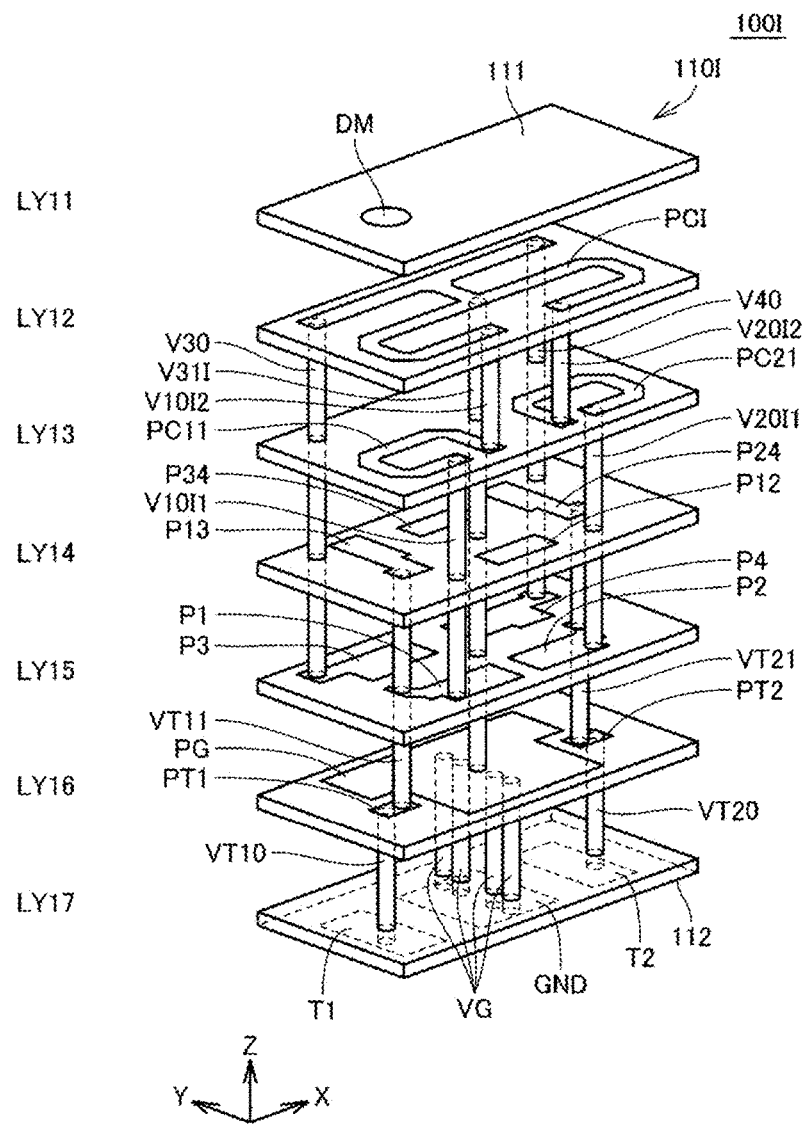
FIG. 19 is an exploded perspective view illustrating an example of a layered structure of a filter device of a ninth modification of a preferred embodiment of the present invention.

FIG. 19 is an exploded perspective view illustrating an example of a layered structure of a filter device 100I of the ninth modification. The filter device 100I basically has a structure configured by combining the structure of the filter device 100D of the fourth modification illustrated in FIG. 14 and the structure of the filter device 100G of the seventh modification illustrated in FIG. 17. In other words, plate electrodes defining a portion of the individual resonators are collectively configured as a single plate electrode PCI in the dielectric layer LY12 of a body 110I similarly to the filter device 100D, and compound coils wound around winding axes in the layer direction are provided in the resonators RC1 and RC2.

Referring to FIG. 19, the plate electrode PCI in the dielectric layer LY12 of the body 110I is coupled to the ground electrode PG in the dielectric layer LY16 by a shared via V31I. Of the plate electrode PCI, an end portion of the loop portion corresponding to the plate electrode PC1 in FIG. 3 is coupled by a via V10I2 to one end of the loop-shaped plate electrode PC11 provided in the dielectric layer LY13. The other end of the plate electrode PC11 is coupled to the capacitor electrode P1 in the dielectric layer LY15 by a via V10I1. The plate electrodes PCI and PC11 and the via V10I2 define a compound coil wound around a winding axis in the layer direction.

Of the plate electrode PCI, an end portion of the loop portion corresponding to the plate electrode PC2 in FIG. 3 is coupled by a via V20I2 to one end of the loop-shaped plate electrode PC21 provided in the dielectric layer LY13. The other end of the plate electrode PC21 is coupled to the capacitor electrode P2 in the dielectric layer LY15 by a via V20I1. The plate electrodes PCI and PC21 and the via V20I2 define a compound coil wound around a winding axis in the layer direction.

Regarding the filter device 100I, redundant descriptions of the same elements as the filter device 100G in FIG. 17 are not repeated.

By forming ground-side vias of resonators in a shared manner as in the filter device 100I, magnetic coupling between the resonators becomes stronger, and as a result, the loss characteristic of the filter device is improved. Further, the input/output impedance is increased by providing compound coils in the input-side resonator and the output-side resonator, and thus, it is possible to achieve lower resonant frequency, size reduction of the filter device, reduction of return loss in the pass band, and wider bandwidth.

Second Preferred Embodiment

In the first preferred embodiment, a structure in which the filter device includes four resonators, for example, has been described. In a second preferred embodiment, a structure in which the filter device includes six resonators, for example, will be described.

Figure 20:
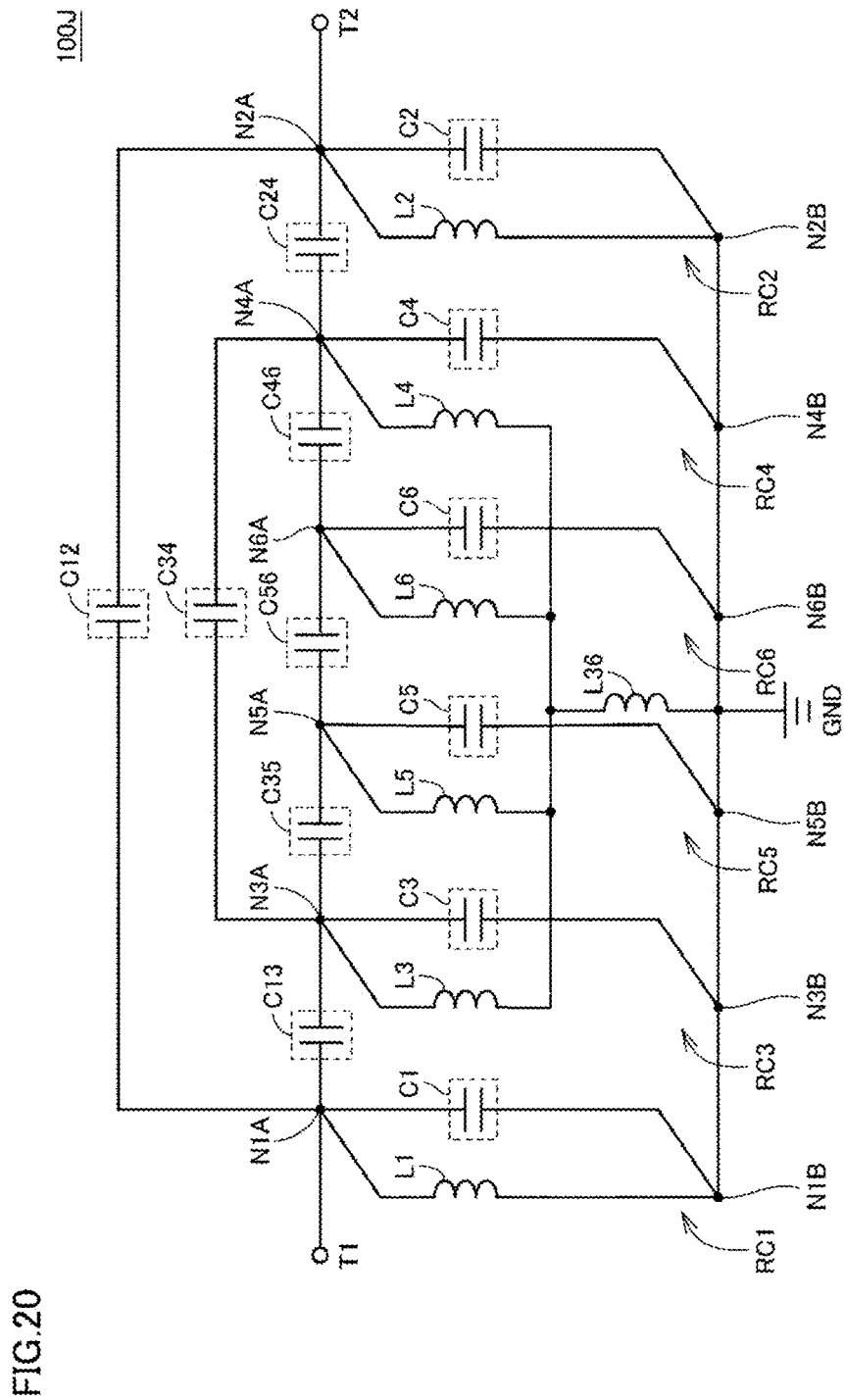
FIG. 20 is an equivalent circuit diagram of a filter device of a second preferred embodiment of the present invention.

FIG. 20 is an equivalent circuit diagram of a filter device 100J of the second preferred embodiment. Referring to FIG. 20, the filter device 100J includes an input terminal T1, an output terminal T2, and resonators RC1 to RC6. The resonators RC1 to RC6 are all LC parallel resonators each including an inductor and a capacitor. The resonator RC1 is coupled to the input terminal T1. The resonator RC2 is coupled to the output terminal T2. The resonators RC3 to RC6 are coupled between the resonators RC1 and RC2. The filter device 100J basically has a structure configured by additionally coupling the resonators RC5 and RC6 between the resonators RC3 and RC4 of the filter device 100 illustrated in FIG. 2.

The resonator RC1 includes an inductor L1 and a capacitor C1, which are coupled in parallel with other. One connection node N1A of the inductor L1 and the capacitor C1 is coupled to the input terminal T1. The other connection node N1B of the inductor L1 and the capacitor C1 is coupled to a ground terminal GND.

The resonator RC2 includes an inductor L2 and a capacitor C2, which are coupled in parallel with other. One connection node N2A of the inductor L2 and the capacitor C2 is coupled to the output terminal T2. The other connection node N1B of the inductor L2 and the capacitor C2 is coupled to the ground terminal GND.

The resonator RC3 includes inductors L3 and L36 coupled in series with each other and a capacitor C3 coupled in parallel with the inductors L3 and L36. A connection node N3A of the inductor L3 and the capacitor C3 is coupled to the connection node N1A of the resonator RC1 (consequently to the input terminal T1) via a capacitor C13. A connection node N3B of the inductor L36 and the capacitor C3 is coupled to the ground terminal GND.

The resonator RC4 includes an inductor L4 and the inductor L36 coupled in series with each other and a capacitor C4 coupled in parallel with the inductors L4 and L36. A connection node N4A of the inductor L4 and the capacitor C4 is coupled to the connection node N2A of the resonator RC2 (consequently to the output terminal T2) via a capacitor C24. A connection node N4B of the inductor L36 and the capacitor C4 is coupled to the ground terminal GND.

The resonator RC5 includes an inductor L5 and the inductor L36 coupled in series with each other and a capacitor C5 coupled in parallel with the inductors L5 and L36. A connection node N5A of the inductor L5 and the capacitor C5 is coupled to the connection node N3A of the resonator RC3 via a capacitor C35. A connection node N5B of the inductor L36 and the capacitor C5 is coupled to the ground terminal GND.

The resonator RC6 includes an inductor L6 and the inductor L36 coupled in series with each other and a capacitor C6 coupled in parallel with the inductors L6 and L36. A connection node N6A of the inductor L6 and the capacitor C6 is coupled to the connection node N4A of the resonator RC4 via a capacitor C46. A connection node N6B of the inductor L36 and the capacitor C6 is coupled to the ground terminal GND. As described above, the resonators RC3 to RC6 share the inductor L36.

The capacitor C12 is coupled between the connection nodes N1A and N2A (in other words, between the input terminal T1 and the output terminal T2). A capacitor C34 is coupled between the connection nodes N3A and N4A. Additionally, a capacitor C56 is coupled between connection nodes N5A and N6A.

The resonators are coupled to each other via electromagnetic fields. As described above, the filter device 100J has a configuration including resonators in four stages coupled to each other via electromagnetic fields, arranged between the input terminal T1 and the output terminal T2. Radio-frequency signals inputted to the input terminal T1 are transferred by electromagnetic field coupling of the resonators RC1 to RC6 and outputted from the output terminal T2. At this time, only signals of a frequency band determined by resonant frequencies of the resonators are transferred to the output terminal T2. As a result, by controlling the resonant frequencies of the individual resonators, the filter device 100J operates as a band pass filter that passes signals of a desired frequency band.

Figure 21:
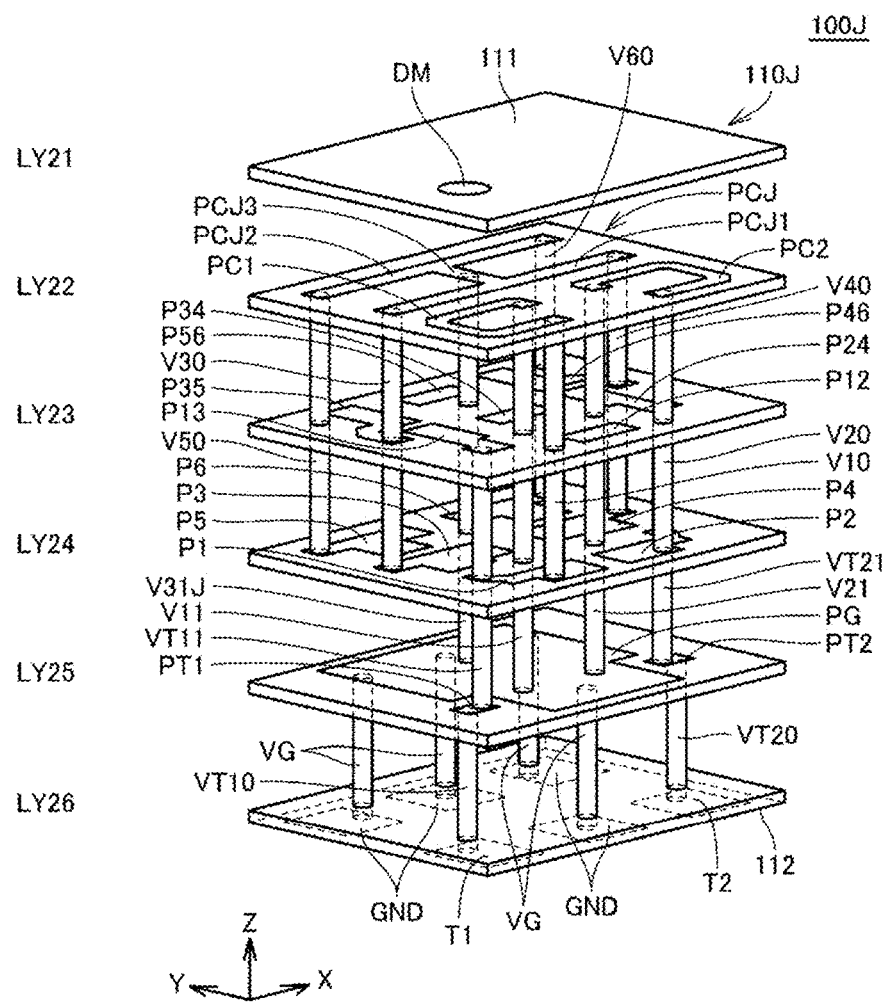
FIG. 21 is an exploded perspective view illustrating an example of a layered structure of the filter device in FIG. 20.

FIG. 21 is an exploded perspective view illustrating an example of a layered structure of the filter device 100J in FIG. 20. In FIG. 21, the same elements as the filter device 100 of the first preferred embodiment in FIG. 3 are denoted by the same reference numerals. Redundant descriptions of the same elements as in FIG. 3 are not repeated.

Referring to FIG. 21, the filter device 100J has a rectangular or almost rectangular solid body 110J including a plurality of dielectric layers LY21 to LY26 that are stacked in a given direction. The dielectric layers of the body 110J are made of a ceramic such as a LTCC, or a resin.

An orientation mark DM indicating the orientation of the filter device 100J is provided on an upper surface 111 (the dielectric layer LY21) of the body 110J. The input terminal T1, the output terminal T2, and a plurality of ground terminals GND, which are external terminals to connect the filter device 100J to external devices, are arranged at a lower surface 112 (the dielectric layer LY26) of the body 110J. The ground terminals GND are coupled to a ground electrode PG provided in the dielectric layer LY25 by corresponding vias VG.

As described with reference to FIG. 20, the filter device 100J includes the LC parallel resonators RC1 to RC6 in six stages. More specifically, the resonator RC1 includes vias V10 and V11, a capacitor electrode P1, and a plate electrode PC1. The resonator RC2 includes vias V20 and V21, a capacitor electrode P2, and a plate electrode PC2. The resonators RC3 to RC6 respectively include vias V30, V40, V50, and V60 and all include a plate electrode PCJ and a via V31J that are shared.

The shared plate electrode PCJ is provided in the dielectric layer LY22. The shared plate electrode PCJ includes a first portion PCJ1 and a third portion PCJ3, which are each a strip-shaped electrode extended in the X-axis direction, and a second portion PCJ2, which connects the first portion PCJ1 and the third portion PCJ3. The second portion PCJ2 is extended from the middle of the first portion PCJ1 and the middle of the third portion PCJ3 in the Y-axis direction.

The first portion PCJ1 of the plate electrode PCJ is adjacent to the plate electrodes PC1 and PC2 defining a portion of the resonator RC1 and a portion of the resonator RC2 in the positive direction of the Y axis. The third portion PCJ3 of the plate electrode PCJ is adjacent to the first portion PCJ1, more forward than the first portion PCJ1 in the positive direction of the Y axis. In other words, the first portion PCJ1 is positioned between the third portion PCJ3 and the plate electrodes PC1 and PC2.

The second portion PCJ2 is coupled to the ground electrode PG in a dielectric layer by the via V31J. The via V31J serves as a shared ground-side via in the resonators RC3 to RC6.

The via V30 is connected to a front end portion of the first portion PCJ1 in the negative direction of the X axis. The first portion PCJ1 and the vias V30 and V31J define the resonator RC3. The via V40 is connected to a front end portion of the first portion PCJ1 in the positive direction of the X axis. The first portion PCJ1 and the vias V40 and V31J define the resonator RC4.

The via V50 is connected to a front end portion of the third portion PCJ3 in the negative direction of the X axis. The via V50 is connected to a capacitor electrode P5 provided in the dielectric layer LY24. When viewed in plan view in the normal direction of the body 110J, a portion of the capacitor electrode P5 overlaps the ground electrode PG. The capacitor electrode P5 and the ground electrode PG define the capacitor C5 in FIG. 20. When viewed in plan view in the normal direction of the body 110J, a portion of the capacitor electrode P5 overlaps a plate electrode P35 provided in the dielectric layer LY23. The plate electrode P35 is connected to the via V30. The capacitor electrode P5 and the plate electrode P35 define the capacitor C35 in FIG. 20.

The via V60 is connected to a front end portion of the third portion PCJ3 in the positive direction of the X axis. The via V60 is connected to a capacitor electrode P6 provided in the dielectric layer LY24. When viewed in plan view in the normal direction of the body 110J, a portion of the capacitor electrode P6 overlaps the ground electrode PG. The capacitor electrode P6 and the ground electrode PG define the capacitor C6 in FIG. 20. When viewed in plan view in the normal direction of the body 110J, a portion of the capacitor electrode P6 overlaps a plate electrode P46 provided in the dielectric layer LY23. The plate electrode P46 is connected to the via V40. The capacitor electrode P6 and the plate electrode P46 define the capacitor C46 in FIG. 20.

When viewed in plan view in the normal direction of the body 110J, a portion of the capacitor electrode P5 and a portion of the capacitor electrode P6 also overlap a plate electrode P56 provided in the dielectric layer LY23. The capacitor electrodes P5 and P6 and the plate electrode P56 define the capacitor C56 in FIG. 20.

It is known that increasing the number of stages of resonators facilitates improvement of the attenuation characteristic outside the pass band and achievement of wider bandwidth in design. However, if the number of stages of resonators is increased in a product of the same size, the distances between resonators are narrowed in the body, and as a result, the Q factor is decreased. Consequently, loss may be increased, so that the bandpass characteristic may be degraded.

As in the filter device 100J of the second preferred embodiment, the distances between resonator groups each including two resonators arranged in the direction along the long side of the body (the X-axis direction) can be increased in the body by positioning the resonator groups adjacent to each other in the direction along the short side of the body (the Y-axis direction). Further, by combining ground-side vias of some resonators in a shared manner, magnetic coupling between the resonators become stronger. The structure as described above improves the Q factor when compared to the filter device including a plurality of resonators arranged in one direction. Consequently, the loss characteristic of the filter device is improved.

Tenth and Eleventh Modifications

The following describes tenth and eleventh modifications in which magnetic coupling between resonators is changed in a filter device including resonators in six stages by altering the structures of plate electrodes defining a portion of the resonators RC3 to RC6.

Tenth Modification

Figure 22:
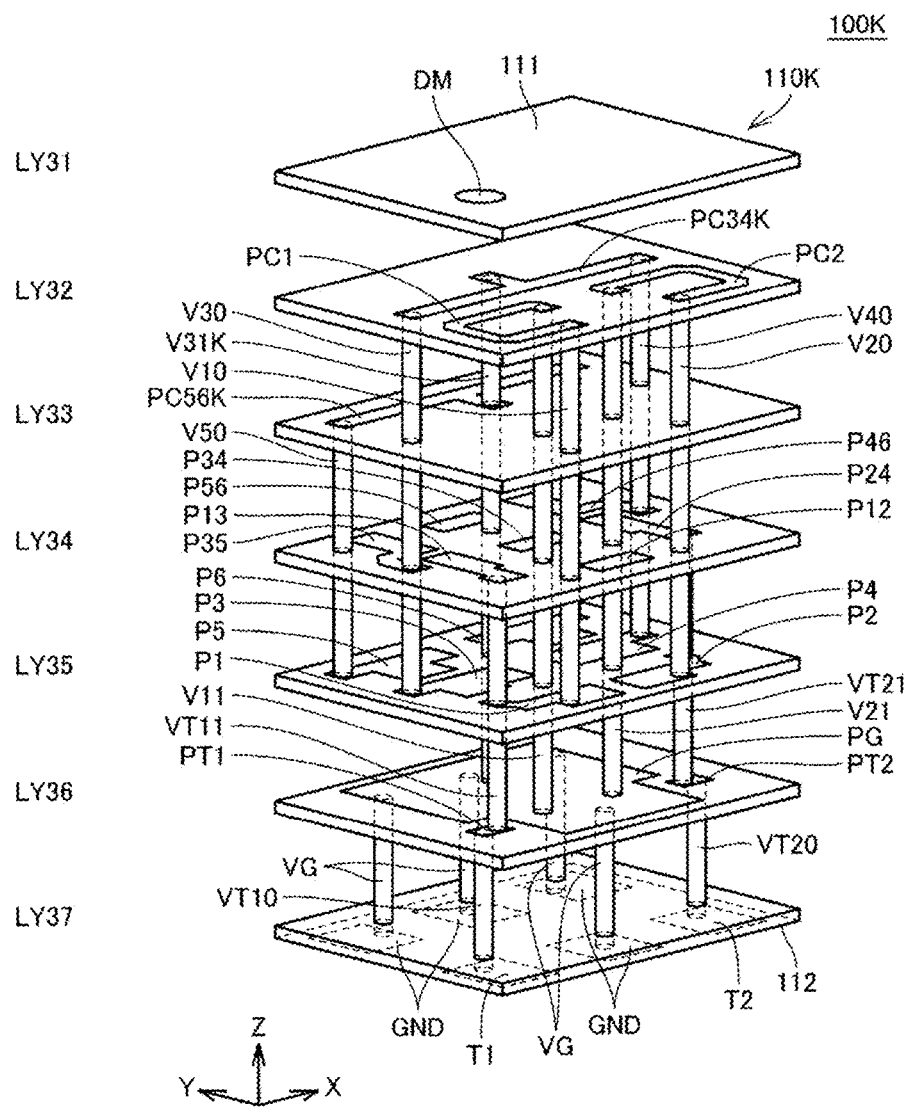
FIG. 22 is an exploded perspective view illustrating an example of a layered structure of a filter device of a tenth modification of a preferred embodiment of the present invention.

FIG. 22 is an exploded perspective view illustrating an example of a layered structure of a filter device 100K of the tenth modification. The filter device 100K basically has a structure in which the plate electrode PCJ in the filter device 100J of the second preferred embodiment illustrated in FIG. 21 is split into a plate electrode for the resonators RC3 and RC4 and a plate electrode for the resonators RC5 and RC6, and the plate electrode for the resonators RC5 and RC6 is positioned at a different level (a dielectric layer).

The following describes details with reference to FIG. 22. The filter device 100K has a rectangular or almost rectangular solid body 110K including a plurality of dielectric layers LY31 to LY37 that are stacked in a given direction. The dielectric layers LY31, and LY34 to LY37 in FIG. 22 respectively correspond to the dielectric layers LY21, and LY23 to LY26 in FIG. 21. Regarding FIG. 22, redundant descriptions of the same elements as in FIG. 21 are not repeated.

The plate electrode PC1 defining a portion of the resonator RC1, the plate electrode PC2 defining a portion of the resonator RC2, and a plate electrode PC34K shared by the resonators RC3 and RC4 are provided in the dielectric layer LY32 of the body 110K. A plate electrode PC56K shared by the resonators RC5 and RC6 is provided in the dielectric layer LY33.

The plate electrode PC34K includes a first portion extended in the X-axis direction and a second portion elongated from the first portion in the positive direction of the Y axis. The via V30 of the resonator RC3 is connected to one end of the first portion of the plate electrode PC34K, and the via V40 of the resonator RC4 is connected to the other end of the first portion of the plate electrode PC34K.

The plate electrode PC56K includes a first portion extended in the X-axis direction and a second portion elongated from the first portion in the negative direction of the Y axis. The via V50 of the resonator RC5 is connected to one end of the first portion of the plate electrode PC56K. The via V60 of the resonator RC6 is connected to the other end of the first portion of the plate electrode PC56K. In FIG. 22, the via V60 is hidden behind other elements.

When the body 110K is viewed in plan view in the normal direction, a portion of the second portion of the plate electrode PC34K overlaps a portion of the second portion of the plate electrode PC56K. By the via V31K extended through the overlap portions, the plate electrodes PC34K and PC56K are coupled to the ground electrode PG in the dielectric layer LY36.

In the filter device 100K, the plate electrode PC34K defining a portion of the resonators RC3 and RC4 and the plate electrode PC56K defining a portion of the resonators RC5 and RC6 are provided in different dielectric layers, and thus, the length of the shared portion of the via V31K is shorter than the filter device 100J of the second preferred embodiment. Further, the length of the vias V50 and V60 of the resonators RC5 and RC6 is shorter than the length of the vias V30 and V40 of the resonators RC3 and RC4, and thus, the region in which the vias V50 and V60 face each other is shorter. As a result, magnetic coupling between the resonators RC3 and RC4 and the resonators RC5 and RC6 is weaker in the filter device 100K than in the filter device 100J.

As in the filter device 100K of the tenth modification, by positioning the plate electrode used as the resonators RC3 and RC4 and the plate electrode used as the resonators RC5 and RC6 in different dielectric layers, magnetic coupling between the resonators can be changed.

Eleventh Modification

Figure 23:
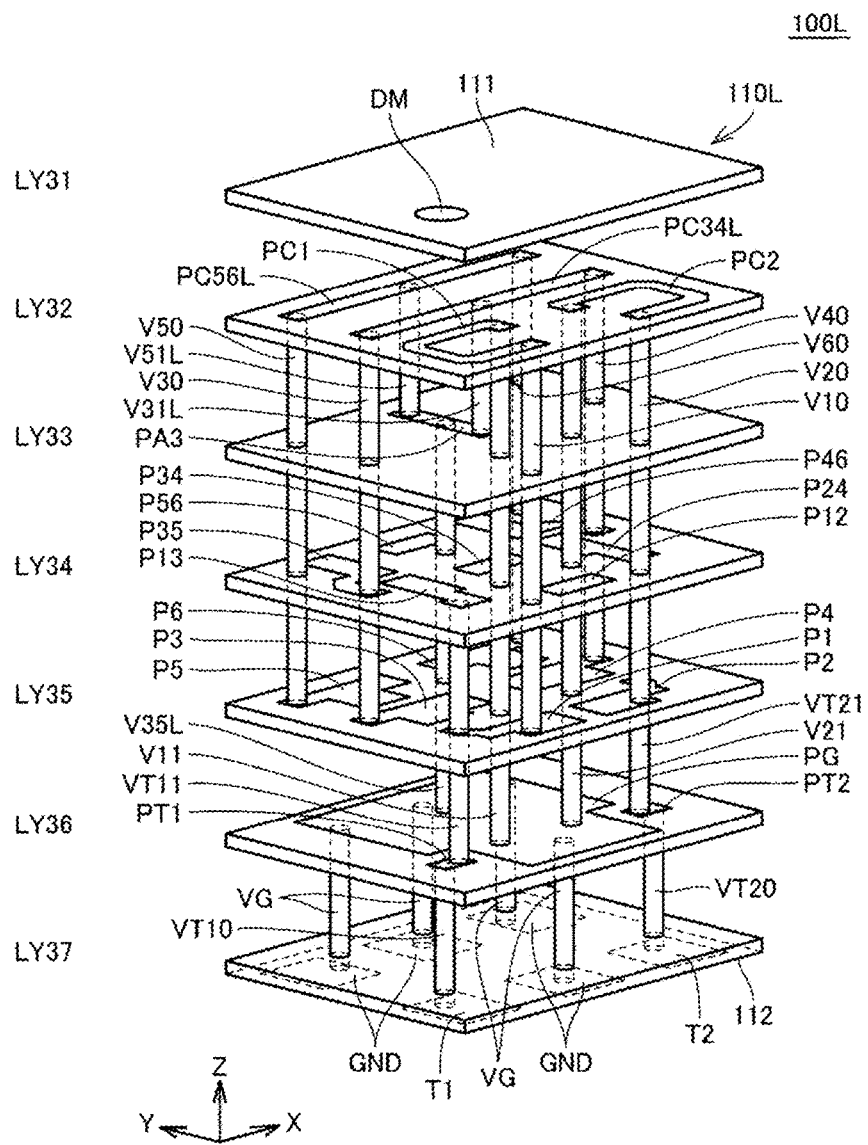
FIG. 23 is an exploded perspective view illustrating an example of a layered structure of a filter device of an eleventh modification of a preferred embodiment of the present invention.

FIG. 23 is an exploded perspective view illustrating an example of a layered structure of a filter device 100L of the eleventh modification. The filter device 100L basically has a structure in which the second portion PCJ2 of the plate electrode PCJ of the filter device 100J of the second preferred embodiment illustrated in FIG. 21 is positioned in a different dielectric layer. Regarding FIG. 23, redundant descriptions of the same elements as in FIGS. 21 and 22 are not repeated.

Referring to FIG. 23, as well as the plate electrode PC1 defining a portion of the resonator RC1 and the plate electrode PC2 defining a portion of the resonator RC2, a plate electrode PC34L defining a portion of the resonators RC3 and RC4 and a plate electrode PC56L defining a portion of the resonators RC5 and RC6 are provided in the dielectric layer LY32 of a body 110L. The plate electrode PC34L corresponds to the first portion PCJ1 of the plate electrode PCJ of the filter device 100J. The plate electrode PC56L corresponds to the third portion PCJ3 of the plate electrode PCJ of the filter device 100J.

A via V31L is connected to the middle of the plate electrode PC34L. A via V51L is connected to the middle of the plate electrode PC56L. The vias V31L and V51L are connected to a plate electrode PA3 provided in the dielectric layer LY33. The plate electrode PA3 is a strip-shaped electrode extending in the Y-axis direction in the dielectric layer LY33. A via V35L is connected to the middle of the plate electrode PA3. The plate electrode PA3 is coupled to the ground electrode PG in the dielectric layer LY36 by the via V35L.

This structure changes the shared region of ground-side via between the resonators RC3 and RC4 and the resonators RC5 and RC6. The shared region of ground-side via between the resonators RC3 and RC4 and the resonators RC5 and RC6 is smaller in the filter device 100L than in the filter device 100J in FIG. 21. As a result, magnetic coupling between the resonators RC3 and RC4 and the resonators RC5 and RC6 in the filter device 100L is weaker than magnetic coupling between the resonators RC3 and RC4 and the resonators RC5 and RC6 in the filter device 100J.

As in the filter device 100L of the eleventh modification, by coupling the plate electrode used as the resonators RC3 and RC4 and the plate electrode used as the resonators RC5 and RC6 at a different dielectric layer, magnetic coupling between the resonators RC3 and RC4 and the resonators RC5 and RC6 can be changed.

Third Preferred Embodiment

The following describes a third preferred embodiment in which the plate electrodes defining a portion of the individual inductors of the resonators are provided in a plurality of layers, thus reducing insertion loss of the filter device.

Figure 24:
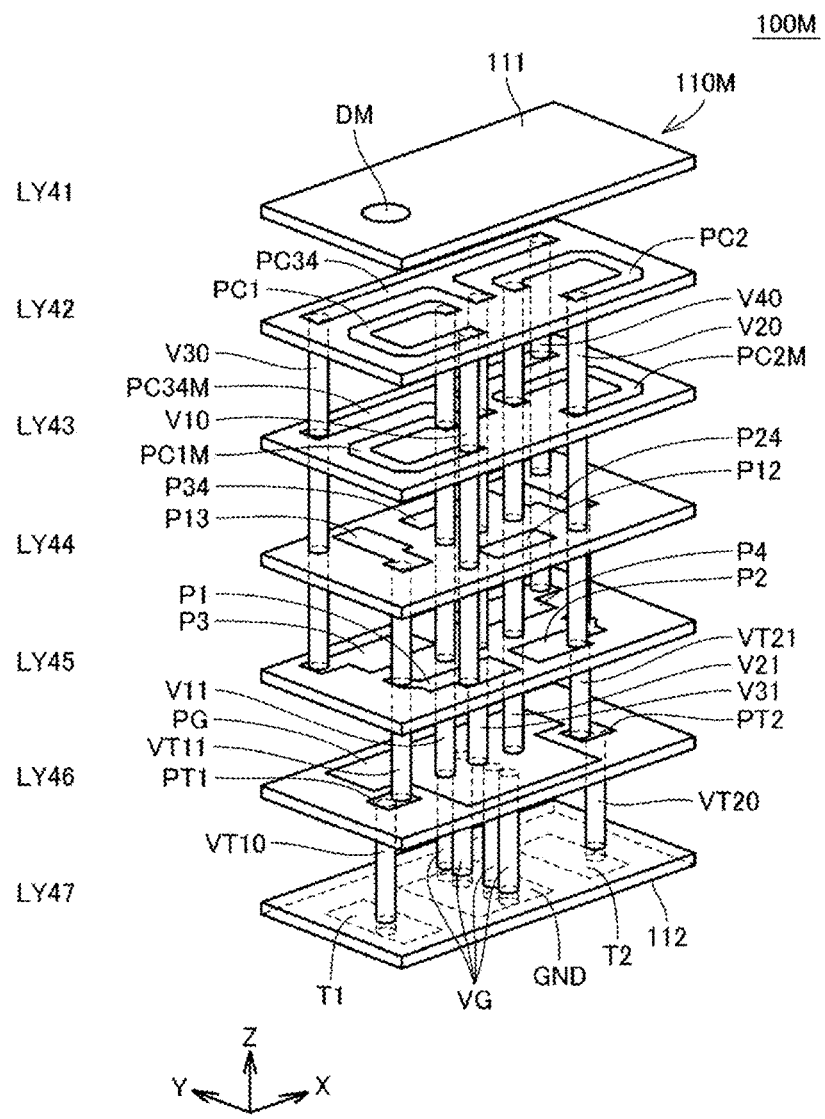
FIG. 24 is an exploded perspective view illustrating an example of a layered structure of a filter device of a third preferred embodiment of the present invention.

FIG. 24 is an exploded perspective view illustrating an example of a layered structure of a filter device 100M of the third preferred embodiment. Referring to FIG. 24, the filter device 100M basically has a structure in which the structures in the dielectric layer LY2 of the filter device 100 of the first preferred embodiment illustrated in FIG. 3 are provided in a plurality of dielectric layers. Regarding the filter device 100M in FIG. 24, redundant descriptions of the same elements as the filter device 100 in FIG. 3 are not repeated.

The filter device 100M has a rectangular or almost rectangular solid body 110M including a plurality of dielectric layers LY41 to LY47 that are stacked in a given direction. The dielectric layers LY41, and LY43 to LY47 in the body 110M correspond to the dielectric layers LY1 to LY6 in FIG. 3.

Plate electrodes PC1M, PC2M, and PC34M are provided in the dielectric layer LY43. The plate electrodes PC1M, PC2M, and PC34M respectively have the same shape as the plate electrodes PC1, PC2, and PC34 in the dielectric layer LY42.

The plate electrode PC1M is connected to the vias V10 and V11, parallel with the plate electrode PC1. The plate electrode PC2M is connected to the vias V20 and V21, parallel with the plate electrode PC2. The plate electrode PC34M is connected to the vias V30, V31, and V40, parallel with the plate electrode PC34.

As described above, by providing the plate electrodes of the resonators in a plurality of layers, a decreased amount of current flows into the individual plate electrodes, and as a result, power loss at the inductors of the resonators is reduced. Consequently, insertion loss in the pass band is reduced in the filter device, and the bandpass characteristic is improved.

Fourth Preferred Embodiment

The following describes a fourth preferred embodiment in which size reduction is achieved while degradation of performance of resonators is reduced or prevented.

Figure 25:
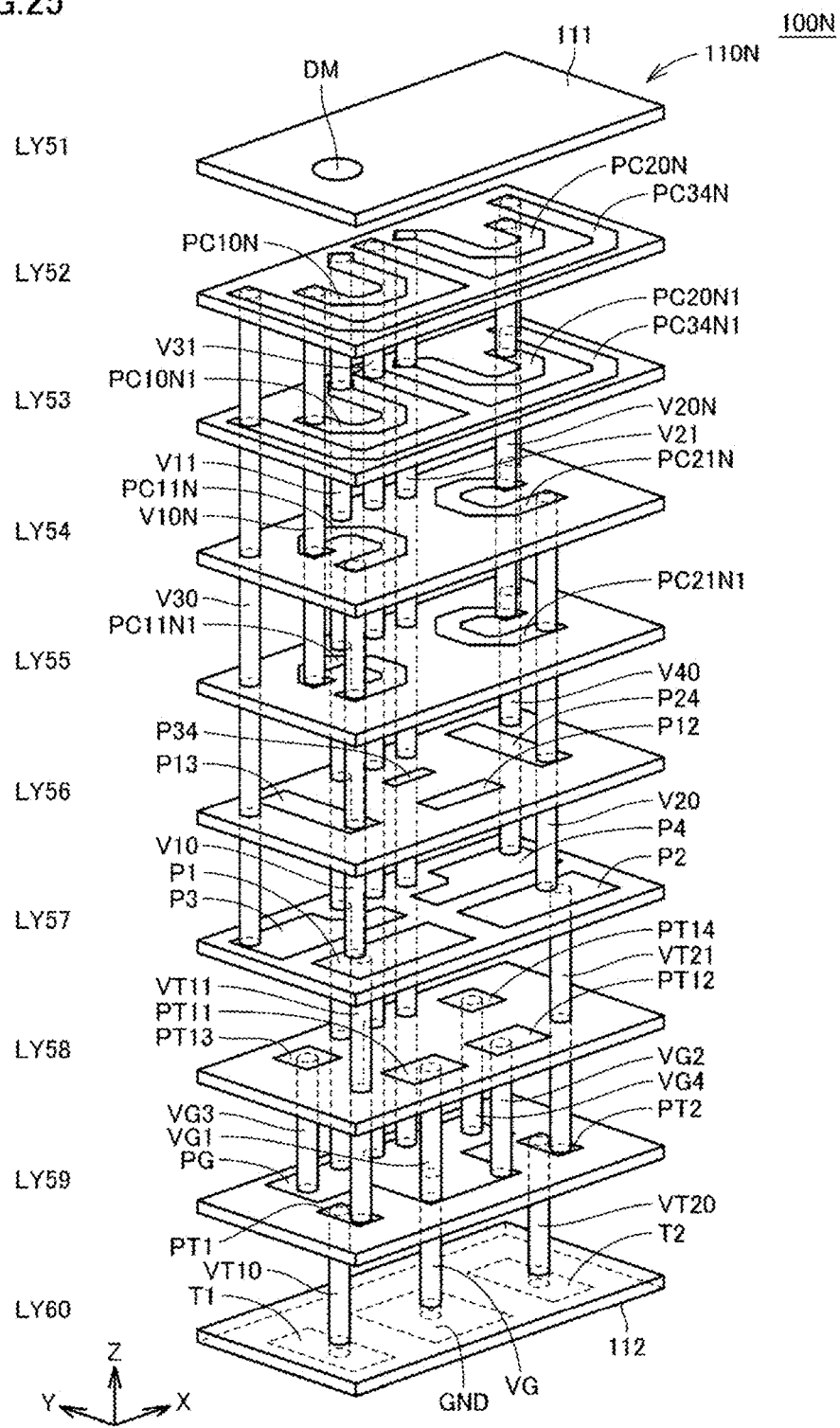
FIG. 25 is an exploded perspective view illustrating an example of a layered structure of a filter device of a fourth preferred embodiment of the present invention.
Figure 26:
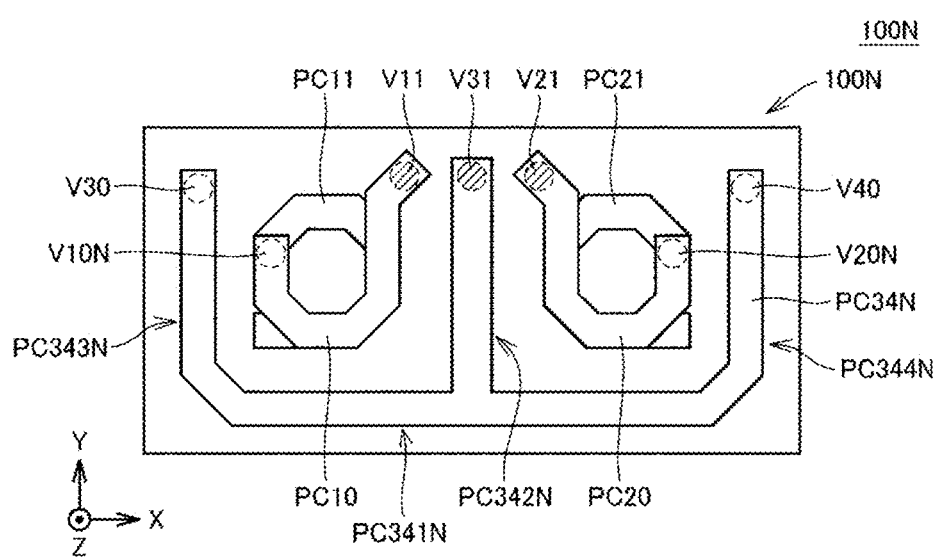
FIG. 26 is a plan view of the filter device in FIG. 25.

FIG. 25 is an exploded perspective view illustrating an example of a layered structure of a filter device 100N of the fourth preferred embodiment. FIG. 26 is a plan view of a portion from a dielectric layer to another dielectric layer of the filter device 100N when viewed in the layer direction. The equivalent circuit of the filter device 100N is the same as the equivalent circuit of the filter device 100 illustrated in FIG. 2.

Referring to FIGS. 25 and 26, in the filter device 100N, the resonators RC1 to RC4 are provided in a body 110N including a plurality of dielectric layers LY51 to LY60.

The resonator RC1 includes vias V10, V10N, and V11, a capacitor electrode P1, and plate electrodes PC10N, PC10N1, PC11N, and PC11N1. The resonator RC2 includes vias V20, V20N, and V21, a capacitor electrode P2, and plate electrodes PC20N, PC20N1, PC21N, and PC21N1.

The resonator RC3 includes vias V30 and V31, a capacitor electrode P3, and plate electrodes PC34N and PC34N1. The resonator RC4 includes vias V40 and V41, a capacitor electrode P4, and the plate electrodes PC34N and PC34N1. The resonators RC3 and RC4 share the via V31 and the plate electrodes PC34N and PC34N1.

An orientation mark DM indicating the orientation of the filter device 100 is provided on an upper surface 111 (the dielectric layer LY51) of the body 110. The input terminal T1, the output terminal T2, and the ground terminal GND, which are external terminals to connect the filter device 100N to external devices, are arranged at a lower surface 112 (the dielectric layer LY60) of the body 110.

The input terminal T1 is coupled by a via VT10 to a plate electrode PT1 provided in the dielectric layer LY59. The plate electrode PT1 is coupled by a via VT11 to the capacitor electrode P1 of the resonator RC1 provided in the dielectric layer LY57.

When viewed in plan view in the normal direction of the body 110, a portion of the capacitor electrode P1 overlaps a capacitor electrode PT11 provided in the dielectric layer LY58. The capacitor electrode PT11 is coupled to the ground electrode PG in the dielectric layer LY59 by a via VG1. The ground electrode PG is coupled to the ground terminal GND by a via VG. As a result, the capacitor electrodes P1 and P11 define the capacitor C1 in FIG. 2.

The capacitor electrode P1 is coupled by the via V10 to one end of the plate electrode PC11N in the dielectric layer LY54 and one end of the plate electrode PC11N1 in the dielectric layer LY55. The plate electrodes PC11N and PC11N1 preferably have the same almost C-shape. The other end of the plate electrode PC11N and the other end of the plate electrode PC11N1 are coupled by the via V10N to one end of the plate electrode PC10N in the dielectric layer LY52 and one end of the plate electrode PC10N1 in the dielectric layer LY53. The plate electrodes PC10N and PC10N1 preferably have the same almost C-shape. The other end of the plate electrode PC10N and the other end of the plate electrode PC10N1 are coupled to the ground electrode PG in the dielectric layer LY59 by the via V11. The plate electrodes PC10N, PC10N1, PC11N, and PC11N1 and the vias V10, V10N, and V11 define the inductor L1 in FIG. 2.

The output terminal T2 is coupled by a via VT20 to a plate electrode PT2 provided in the dielectric layer LY59. The plate electrode PT2 is coupled by a via VT21 to the capacitor electrode P2 of the resonator RC2 provided in the dielectric layer LY57.

When viewed in plan view in the normal direction of the body 110, a portion of the capacitor electrode P2 overlaps a capacitor electrode PT12 provided in the dielectric layer LY58. The capacitor electrode PT12 is coupled to the ground electrode PG in the dielectric layer LY59 by a via VG2. The capacitor electrodes P2 and P12 define the capacitor C2 in FIG. 2.

The capacitor electrode P2 is coupled by the via V20 to one end of the plate electrode PC21N in the dielectric layer LY54 and one end of the plate electrode PC21N1 in the dielectric layer LY55. The plate electrodes PC21N and PC21N1 preferably have the same almost C-shape. The other end of the plate electrode PC21N and the other end of the plate electrode PC21N1 are coupled by the via V20N to one end of a plate electrode PC12N in the dielectric layer LY52 and one end of the plate electrode PC20N1 in the dielectric layer LY53. The plate electrodes PC20N and PC20N1 preferably have the same almost C-shape. The other end of the plate electrode PC20N and the other end of the plate electrode PC20N1 are coupled to the ground electrode PG in the dielectric layer LY59 by the via V21. The plate electrodes PC20N, PC20N1, PC21N, and PC21N1 and the vias V20, V20N, and V21 define the inductor L2 in FIG. 2.

When viewed in plan view in the normal direction of the body 110, the capacitor electrode P1 of the resonator RC1 and the capacitor electrode P2 of the resonator RC2 partially overlap the capacitor electrode P12 provided in the dielectric layer LY56. The capacitor electrodes P1, P2, and P12 define the capacitor C12 in FIG. 2.

The via V10 of the resonator RC1 is also connected to a capacitor electrode P13 extended in the dielectric layer LY56 in the Y-axis direction. When viewed in plan view in the normal direction of the body 110, a portion of the capacitor electrode P13 overlaps the capacitor electrode P3 of the resonator R3 provided in the dielectric layer LY57. The capacitor electrodes P3 and P13 define the capacitor C13 in FIG. 2. The capacitor electrode P3 is coupled by the via V30 to the plate electrode PC34N in the dielectric layer LY52 and the plate electrode PC34N1 in the dielectric layer LY53.

The via V20 of the resonator RC2 is also connected to a capacitor electrode P24 extended in the dielectric layer LY56 in the Y-axis direction. When viewed in plan view in the normal direction of the body 110, a portion of the capacitor electrode P24 overlaps the capacitor electrode P4 of the resonator R4 provided in the dielectric layer LY57. The capacitor electrodes P4 and P24 define the capacitor C24 in FIG. 2. The capacitor electrode P4 is coupled by the via V40 to the plate electrode PC34N in the dielectric layer LY52 and the plate electrode PC34N1 in the dielectric layer LY53.

The plate electrodes PC34N and PC34N1 preferably have the same almost E-shape. As illustrated in FIG. 26, the plate electrode PC34N includes a first portion PC341N and three extended portions (a second portion PC342N, a third portion PC343N, and a fourth portion PC344N). The first portion PC341N is a strip-shaped electrode extended in the X-axis direction. The second portion PC342N, the third portion PC343N, and the fourth portion PC344N are extended from the first portion PC341N in the positive direction of the Y axis. The second portion PC342N is elongated from the middle of the first portion PC341N in the extension direction (the X-axis direction) of the first portion PC341N to a space between the plate electrodes PC10N and PC20N. The third portion PC343N is extended in the positive direction of the Y axis from a front end portion of the first portion PC341N in the negative direction of the X axis (the first end portion). The fourth portion PC344N is extended in the positive direction of the Y axis from a front end portion of the first portion PC341N in the positive direction of the X axis (the second end portion). The plate electrode PC34N1 preferably has the same shape as the plate electrode PC34N.

The via V30 of the resonator RC3 is connected to an end portion of the third portion of the plate electrode PC34N and an end portion of the third portion of the plate electrode PC34N1. The via V40 of the resonator RC4 is connected to an end portion of the third portion of the plate electrode PC34N and an end portion of the third portion of the plate electrode PC34N1.

The via 31 shared by the resonators RC3 and RC4 is connected to an end portion of the second portion of the plate electrode PC34N and an end portion of the second portion of the plate electrode PC34N1. The via V31 is connected to the ground electrode PG in the dielectric layer LY59.

When viewed in plan view in the normal direction of the body 110, the capacitor electrode P3 of the resonator RC3 and the capacitor electrode P4 of the resonator RC4 partially overlap the capacitor electrode P34 provided in the dielectric layer LY56. The capacitor electrodes P3, P4, and P34 define the capacitor C34 in FIG. 2.

As described above, the equivalent circuit of the filter device 100N of the fourth preferred embodiment is basically the same as the filter device 100 of the first preferred embodiment. Two resonators are arranged in the X-axis direction, and two resonators are arranged also in the Y-axis direction. This structure increases the distances between adjacent resonators. As a result, although the area of the entire dielectric layer is the same, the Q factor is increased, and loss in the filter device is reduced.

Further, in the filter device 100N of the fourth preferred embodiment, as illustrated in FIG. 26, the resonator RC1 coupled to the input terminal T1 is provided in the region surrounded by the first portion PC341N, the second portion PC342N, and the third portion PC343N of the plate electrode PC34N defining the resonator RC3. The resonator RC2 coupled to the output terminal T2 is provided in the region surrounded by the first portion PC341N, the second portion PC342N, and the fourth portion PC344N of the plate electrode PC34N of the resonator RC4.

With this resonator positioning, the distance between vias connected to the plate electrode of the resonator RC3 in the second stage and the resonator RC4 in the third stage is increased, and as a result, the inductance of the resonators is increased. Usually, to decrease the resonant frequency or reduce the size of a filter device, the capacitance or inductance of resonators is increased. However, if capacitance is increased to an excessive level, the Q factor is in turn decreased. Hence, as the filter device 100N, by increasing the line length of the plate electrodes to increase inductance, while reducing or preventing decreases in the Q factor, it is possible to lower the resonant frequency and/or reduce the size.

In four-stage filters, cross coupling of the resonator RC1 coupled to the input terminal T1 and the resonator RC4 coupled to the output terminal T2 produces an attenuation pole. Thus, if vias connected to input and output terminals are coupled to the shield of another device or a casing outside the filter device, filter characteristics may be affected.

In the filter device 100N of the fourth preferred embodiment, when the body 110 is viewed in plan view in the layer direction, the resonators RC1 and RC4 are positioned inside the resonators RC2 and RC3, and as a result, the vias connected to the input and output terminals are positioned closer to the center of the body 110 than the resonators RC2 and RC3. As compared to the case in which vias connected to input and output terminals are positioned close to the periphery of the body 110, this structure reduces or prevents coupling between vias connected to input and output terminals and an external shield. As such, effects of the external shield on filter characteristics are reduced.

Twelfth Modification

Figure 27:
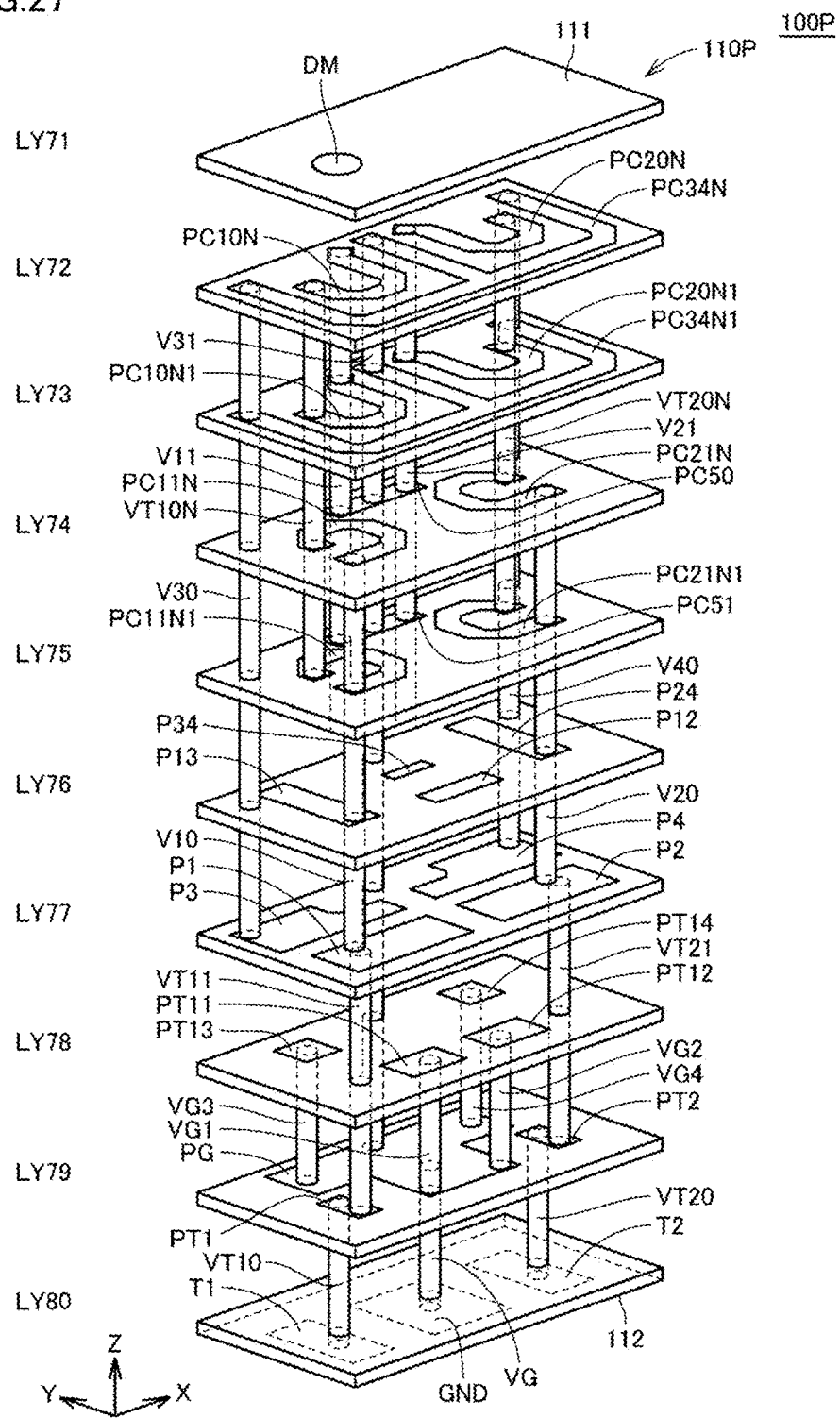
FIG. 27 is an exploded perspective view illustrating an example of a layered structure of a filter device of a twelfth modification of a preferred embodiment of the present invention.
Figure 28:
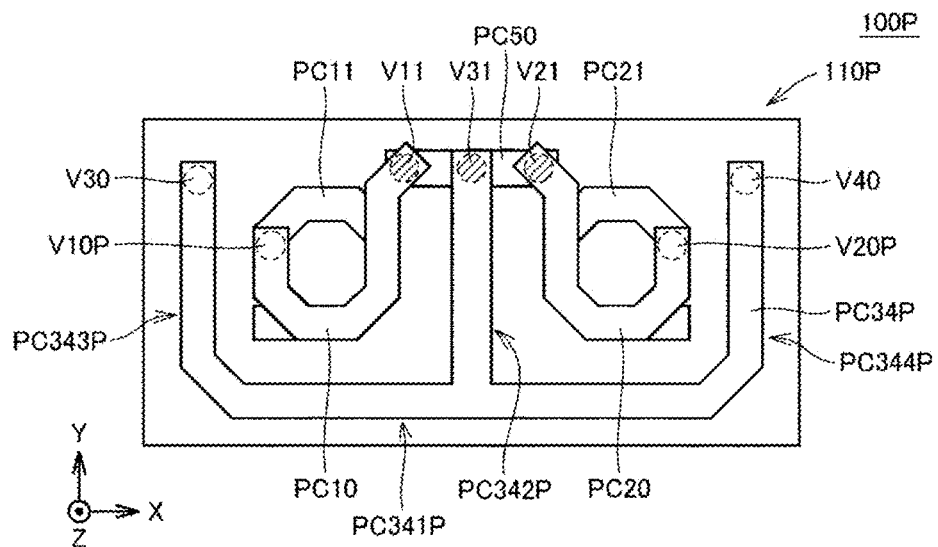
FIG. 28 is a plan view of the filter device in FIG. 27.

FIG. 27 is an exploded perspective view illustrating an example of a layered structure of a filter device 100P of the twelfth modification. FIG. 28 is a plan view of a portion from a dielectric layer to another dielectric layer of the filter device 100P when viewed in the layer direction.

The filter device 100P has a structure in which the vias connecting the plate electrodes in the dielectric layer LY52 to the ground electrode PG in the filter device 100N of the fourth preferred embodiment are combined in a shared manner at some midpoint. Regarding FIGS. 27 and 28, redundant descriptions of the same elements as in FIGS. 25 and 26 are not repeated.

Referring to FIGS. 27 and 28, the filter device 100P has a rectangular or almost rectangular solid body 110P including a plurality of dielectric layers LY71 to LY80 that are stacked in a given direction.

In the body 110P, one end of the plate electrode PC10N and one end of the plate electrode PC10N1, that define the resonator RC1, are connected to the via V11. The via V11 is extended from the dielectric layer LY72 to the dielectric layer LY75 and connected to a plate electrode PC50 in the dielectric layer LY74 and to a plate electrode PC51 in the dielectric layer LY75. The plate electrodes PC50 and PC51 are linear electrodes extended in the X-axis direction in the dielectric layers LY74 and LY75.

The via V21 connected to one end of the plate electrode PC20 and one end of the plate electrode PC20N, which define the resonator RC2, and the via V31 connected to one end of the plate electrode PC34N and one end of the plate electrode PC34N1, which define the resonators RC3 and RC4, are connected to the plate electrodes PC50 and PC51. Similarly to the via V11, the via V21 is extended from the dielectric layer LY72 to the dielectric layer LY75. By contrast, the via V31 is extended from the dielectric layer LY72 to the dielectric layer LY79 and connected to the ground electrode PG. This means that the vias V11 and V21 are combined into the via V31 by the plate electrodes PC50 and PC51 in a shared manner.

As described above, by combining the vias defining the resonators, extended from the plate electrodes to the ground electrode PG, magnetic coupling between the resonators RC1 and RC2, magnetic coupling between the resonators RC1 and RC3, and magnetic coupling between the resonators RC2 and RC4 become stronger than in the filter device 100N of the fourth preferred embodiment. When magnetic coupling between resonators becomes stronger, impedance is increased. As a result, the pass band width is expanded, and/or the steepness of attenuation at positions close to ends of the pass band width is increased.

Thirteenth Modification

Figure 29:
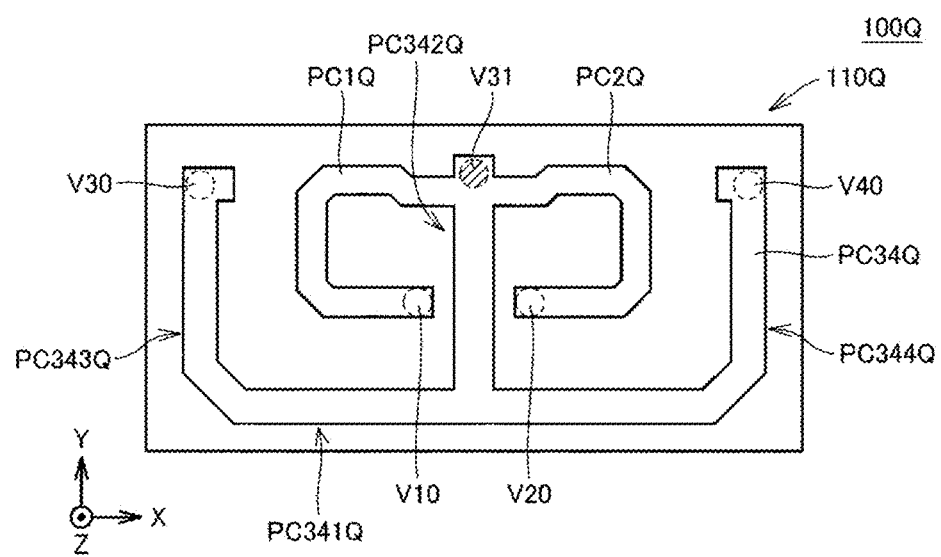
FIG. 29 is a plan view of a filter device of a thirteenth modification of a preferred embodiment of the present invention.

FIG. 29 is a plan view of a filter device 100Q of a thirteenth modification when the filter device 100Q is viewed in the layer direction. In the filter device 100Q, one end of a plate electrode PC1Q defining the resonator RC1 and one end of a plate electrode PC2Q defining the resonator RC2 are both connected to the via V31 of the resonators RC3 and RC4. This means that the plate electrodes PC1Q and PC2Q, and a plate electrode PC34Q are coupled to the ground electrode PG by the shared via V31. By coupling all the resonators RC1 to RC4 to the ground electrode PG by the shared via V31, magnetic coupling between the resonators becomes stronger than in the twelfth modification. As a result, the pass band width is expanded more, and the steepness of attenuation is increased as well.

Further, in the filter device 100Q of the thirteenth modification, the vias V10 and V20 connected to the input and output terminals are positioned closer to the center of the body 110 than the filter devices 100N and 100P. As a result, in the filter device 100Q, it is possible to further reduce or prevent degradation of filter characteristics due to the effect of an external shield.

It should be noted that "the resonator RC1" to "the resonator RC6" in the preferred embodiments and modifications described above respectively correspond to "a first resonator" to "a sixth resonator".

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a body;
    an input terminal;
    an output terminal;
    a ground terminal; and
    a plurality of resonators provided in the body to be coupled to each other by electromagnetic field coupling; wherein
    the plurality of resonators include:
        a first resonator coupled to the input terminal;
        a second resonator coupled to the output terminal and adjacent to the first resonator in a first direction;
        a third resonator adjacent to the first resonator in a second direction perpendicular to the first direction; and
        a fourth resonator adjacent to the third resonator in the first direction;
    the third resonator and the fourth resonator partially share a path connected to the ground terminal;
    the plurality of resonators each include:
        a plate electrode;
        a first via including one end connected to the plate electrode and another end connected to the ground terminal via a capacitor; and
        a second via including one end connected to the plate electrode and another end connected to the ground terminal; and
    the second via of the third resonator and the second via of the fourth resonator are combined in a shared manner.

2. The filter device according to claim 1, wherein the filter device is a band pass filter to pass a signal in a particular frequency band.

3. The filter device according to claim 1, wherein
the plate electrode of the third resonator and the plate electrode of the fourth resonator include a first portion defining a strip electrode extended in the first direction;
the first via of the third resonator is connected to a first end portion of the first portion;
the first via of the fourth resonator is connected to a second end portion of the first portion; and
the second via shared by the third resonator and the fourth resonator is connected between the first end portion and the second end portion of the first portion.

4. The filter device according to claim 3, wherein the shared second via is repositioned at a level different from a level including the first portion in the body.

5. The filter device according to claim 1, wherein the plate electrode of the third resonator and the plate electrode of the fourth resonator include:
a first portion defining a strip electrode extended in the first direction; and
a second portion elongated in the second direction toward the first resonator from a middle of the first portion in the first direction;
the first via of the third resonator is connected to a first end portion of the first portion;
the first via of the fourth resonator is connected to a second end portion of the first portion; and
the second via shared by the third resonator and the fourth resonator is connected to the second portion.

6. The filter device according to claim 1, wherein the plate electrode of the third resonator and the plate electrode of the fourth resonator include:
a first portion defining a strip electrode extended in the first direction;
a second portion elongated in the second direction toward the first resonator from a middle of the first portion in the first direction;
a third portion elongated from a first end portion of the first portion in the same direction as the second portion; and
a fourth portion elongated from a second end portion of the first portion in the same direction as the second portion;
the first via of the third resonator is connected to the third portion;
the first via of the fourth resonator is connected to the fourth portion; and
the second via shared by the third resonator and the fourth resonator is connected to the second portion.

7. The filter device according to claim 6, wherein
the first resonator is positioned in a region surrounded by the first portion, the second portion, and the third portion; and
the second resonator is positioned in a region surrounded by the first portion, the second portion, and the fourth portion.

8. The filter device according to claim 1, wherein the plate electrode of the third resonator and the plate electrode of the fourth resonator include:
a first portion defining a strip electrode extended in the first direction;
a second portion elongated in the second direction toward the first resonator from a middle of the first portion in the first direction;
a fifth portion elongated from a first end portion of the first portion in a direction opposite to the second portion; and
a sixth portion elongated from a second end portion of the first portion in the direction opposite to the second portion;
the first via of the third resonator is connected to the fifth portion;
the first via of the fourth resonator is connected to the sixth portion; and
the second via shared by the third resonator and the fourth resonator is connected to the second portion.

9. The filter device according to claim 1, wherein the second via of the first resonator and the second via of the second resonator are combined with the second via of the third resonator and the second via of the fourth resonator in a shared manner.

10. The filter device according to claim 9, wherein the second via of the first resonator and the second via of the second resonator are combined with the second via of the third resonator and the second via of the fourth resonator in a shared manner at a level different from a level including the plate electrode in the body.

11. The filter device according to claim 1, wherein the plate electrode of the first resonator and the plate electrode of the second resonator include coils wound in a winding direction that is a normal direction of the body.

12. The filter device according to claim 1, wherein the plate electrode of the first resonator and the plate electrode of the second resonator are coils wound in a winding direction that is a direction perpendicular or substantially perpendicular to a normal direction of the body.

13. The filter device according to claim 1, wherein the plurality of resonators further include:
a fifth resonator adjacent to the third resonator in the second direction; and
a sixth resonator adjacent to the fifth resonator in the first direction; and
the third to sixth resonators partially share a path connected to the ground terminal.

14. A radio-frequency front-end circuit comprising the filter device according to claim 1.

15. The radio-frequency front-end circuit according to claim 14, wherein the plate electrode of the third resonator and the plate electrode of the fourth resonator include:
a first portion defining a strip electrode extended in the first direction; and
a second portion elongated in the second direction toward the first resonator from a middle of the first portion in the first direction;
the first via of the third resonator is connected to a first end portion of the first portion;
the first via of the fourth resonator is connected to a second end portion of the first portion; and
the second via shared by the third resonator and the fourth resonator is connected to the second portion.

16. The radio-frequency front-end circuit according to claim 14, wherein the plate electrode of the third resonator and the plate electrode of the fourth resonator include:
a first portion defining a strip electrode extended in the first direction;
a second portion elongated in the second direction toward the first resonator from a middle of the first portion in the first direction;
a third portion elongated from a first end portion of the first portion in the same direction as the second portion; and a fourth portion elongated from a second end portion of the first portion in the same direction as the second portion;

the first via of the third resonator is connected to the third portion;

the first via of the fourth resonator is connected to the fourth portion; and the second via shared by the third resonator and the fourth resonator is connected to the second portion.

17. The radio-frequency front-end circuit according to claim 14, wherein the plate electrode of the third resonator and the plate electrode of the fourth resonator include a first portion defining a strip electrode extended in the first direction;

the first via of the third resonator is connected to a first end portion of the first portion;

the first via of the fourth resonator is connected to a second end portion of the first portion; and the second via shared by the third resonator and the fourth resonator is connected between the first end portion and the second end portion of the first portion.

18. The radio-frequency front-end circuit according to claim 17, wherein the shared second via is repositioned at a level different from a level including the first portion in the body.

\* \* \* \* \*